(12) United States Patent
Hopkins et al.

(10) Patent No.: US 11,282,847 B2
(45) Date of Patent: *Mar. 22, 2022

(54) METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

This patent is subject to a terminal disclaimer.

(21) Appl. No.: 15/931,116

(22) Filed: May 13, 2020

(65) Prior Publication Data

US 2021/0358929 A1    Nov. 18, 2021

(51) Int. Cl.
*H01L 27/11582* (2017.01)
*H01L 27/11556* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ............ H01L 27/11578; H01L 27/11582
See application file for complete search history.

(56) References Cited

U.S. PATENT DOCUMENTS 9,431,419 B2   8/2016 Fukuzumi et al.
9,741,737 B1   8/2017 Huang et al.
(Continued)

FOREIGN PATENT DOCUMENTS

CN    102760738      10/2012
KR    10-2016-0018921   2/2016
(Continued)

OTHER PUBLICATIONS

U.S. Appl. No. 15/930,222, filed May 12, 2020, by Hopkins.
(Continued)

*Primary Examiner* — Christopher A Johnson
(74) *Attorney, Agent, or Firm* — Wells St. John P.S.

(57) ABSTRACT

A method used in forming a memory array comprising strings of memory cells comprises forming a lower portion of a stack that will comprise vertically-alternating first tiers and second tiers on a substrate. The stack comprises laterally-spaced memory-block regions. Material of the first tiers is of different composition from material of the second tiers. Horizontally-elongated lines are formed in the lower portion that are individually between immediately-laterally-adjacent of the memory-block regions. The lines comprise sacrificial material. The lines individually comprise laterally-opposing projections longitudinally there-along in a lowest of the first tiers. The vertically-alternating first tiers and second tiers of an upper portion of the stack are formed above the lower portion and the lines, and channel-material strings are formed that extend through the first tiers and the second tiers in the upper portion to the lower portion. Horizontally-elongated trenches are formed into the stack that are individually between the immediately-laterally-adjacent memory-block regions and extend to the line there-between. The sacrificial material of the lines and projections is removed through the trenches. Intervening material is formed in the trenches and void-spaces left as a result of the removing of the sacrificial material of the lines. Other embodiments are disclosed.

31 Claims, 19 Drawing Sheets

(51) Int. Cl.
*H01L 27/1157* (2017.01)
*H01L 27/11565* (2017.01)
*H01L 27/11519* (2017.01)
*H01L 27/11524* (2017.01)

(52) U.S. Cl.
CPC .. *H01L 27/11524* (2013.01); *H01L 27/11565* (2013.01); *H01L 27/11582* (2013.01)

(56) References Cited

U.S. PATENT DOCUMENTS

| | | | |
|---|---|---|---|
| 9,978,772 | B1 | 5/2018 | Carlson |
| 10,236,301 | B1 | 3/2019 | Howder et al. |
| 10,566,241 | B1 | 2/2020 | Chandolu et al. |
| 2009/0166710 | A1 | 7/2009 | Shimizu et al. |
| 2010/0109072 | A1 | 5/2010 | Kidoh et al. |
| 2011/0147824 | A1 | 6/2011 | Son et al. |
| 2011/0298013 | A1 | 12/2011 | Hwang et al. |
| 2011/0303971 | A1 | 12/2011 | Lee et al. |
| 2012/0156848 | A1 | 6/2012 | Yang et al. |
| 2012/0273865 | A1 | 11/2012 | Lee et al. |
| 2015/0017770 | A1 | 1/2015 | Lee et al. |
| 2015/0318301 | A1 | 11/2015 | Lee et al. |
| 2016/0043100 | A1 | 2/2016 | Lee et al. |
| 2016/0111435 | A1 | 4/2016 | Pang et al. |
| 2016/0163389 | A1* | 6/2016 | Zhang ................ H01L 27/1157 365/185.17 |
| 2016/0163729 | A1 | 6/2016 | Zhang et al. |
| 2016/0172370 | A1 | 6/2016 | Makala et al. |
| 2016/0204117 | A1 | 7/2016 | Liu et al. |
| 2016/0225754 | A1 | 8/2016 | Jang |
| 2016/0233230 | A1 | 8/2016 | Furuhashi et al. |
| 2016/0268302 | A1 | 9/2016 | Lee et al. |
| 2017/0054036 | A1 | 2/2017 | Dorhout et al. |
| 2017/0236896 | A1 | 8/2017 | Lu et al. |
| 2017/0243650 | A1 | 8/2017 | Ogawa et al. |
| 2017/0278859 | A1 | 9/2017 | Sharangpani et al. |
| 2017/0309339 | A1 | 10/2017 | Hsiung et al. |
| 2018/0114794 | A1 | 4/2018 | Jang et al. |
| 2018/0122906 | A1* | 5/2018 | Yu .................... H01L 27/11524 |
| 2018/0204849 | A1 | 7/2018 | Carlson et al. |
| 2018/0254285 | A1 | 9/2018 | Lee et al. |
| 2018/0294273 | A1 | 10/2018 | Liao et al. |
| 2018/0323213 | A1 | 11/2018 | Arai |
| 2019/0096905 | A1 | 3/2019 | Park et al. |
| 2020/0279855 | A1 | 9/2020 | Tran et al. |

FOREIGN PATENT DOCUMENTS

| | | |
|---|---|---|
| KR | 10-2016-0094186 | 8/2016 |
| KR | 10-2017-0093099 | 8/2017 |
| KR | 10-2018-0045975 | 5/2018 |
| TW | 201901933 | 1/2019 |
| WO | WO 2016/093947 | 6/2016 |

OTHER PUBLICATIONS

U.S. Appl. No. 15/930,724, filed May 13, 2020, by Hopkins.
U.S. Appl. No. 15/930,836, filed May 13, 2020, by Hopkins et al.
U.S. Appl. No. 15/931,299, filed May 13, 2020, by Hopkins et al.
U.S. Appl. No. 16/194,946, filed Nov. 19, 2018, by Clampitt et al.
U.S. Appl. No. 16/251,241, filed Jan. 18, 2019, by Howder et al.
U.S. Appl. No. 16/277,311, filed Feb. 15, 2019, by Bhushan et al.
U.S. Appl. No. 16/807,388, filed Mar. 3, 2020, by Hopkins.
U.S. Appl. No. 16/807,523, filed Mar. 3, 2020, by Hopkins.
U.S. Appl. No. 16/807,573, filed Mar. 3, 2020, by Hopkins et al.
Shie, "The Interface Investigation of High-K Material Al2O3 on Si Substrate", A Thesis Submitted to the Institute of Electronics, College of Electrical Engineering and Computer Science, National Chiao Tung University, 2004, Taiwan, 63 pgs.
U.S. Appl. No. 16/894,519, filed Jun. 5, 2020, by Hopkins et al.

* cited by examiner

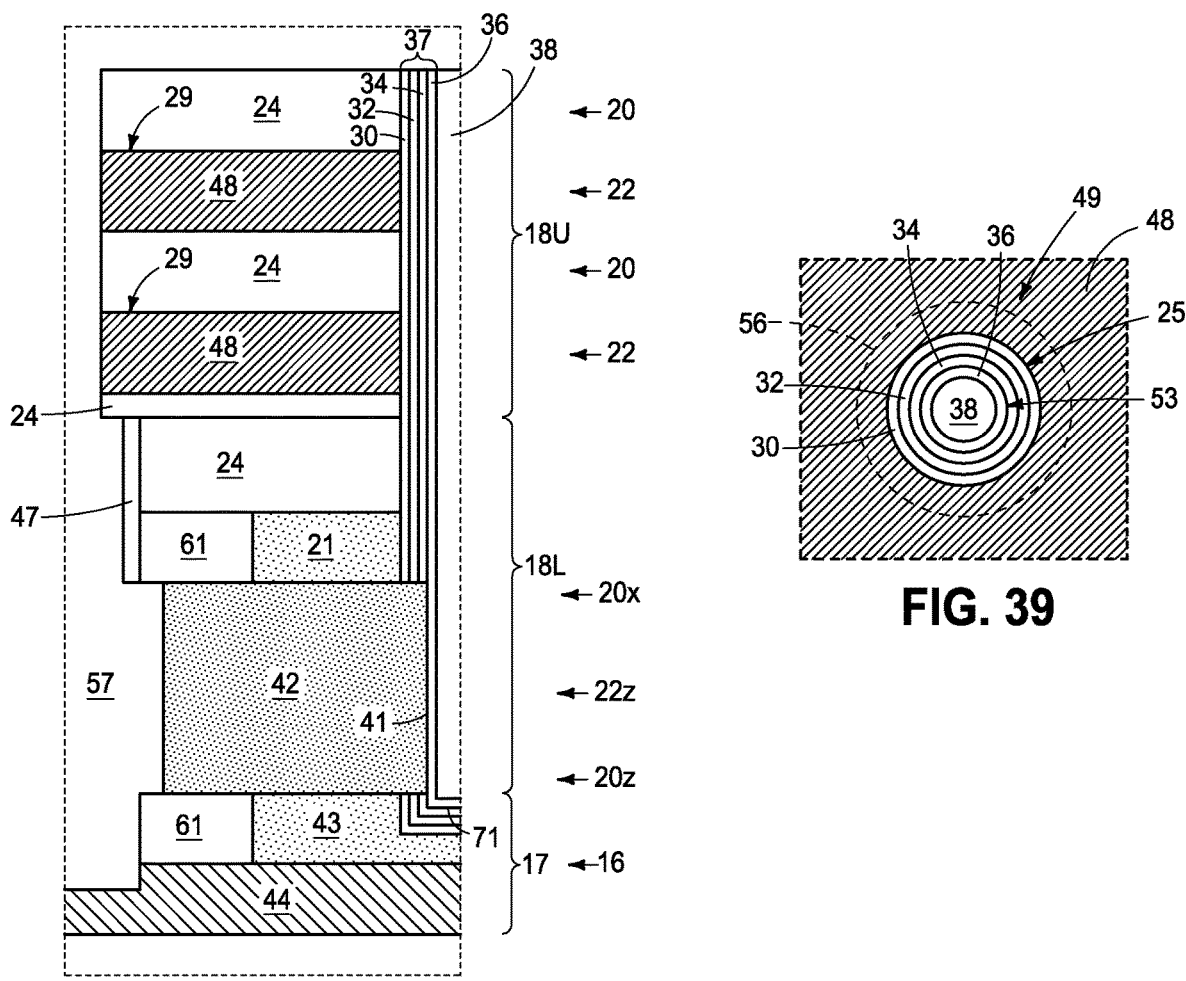
FIG. 38
FIG. 39
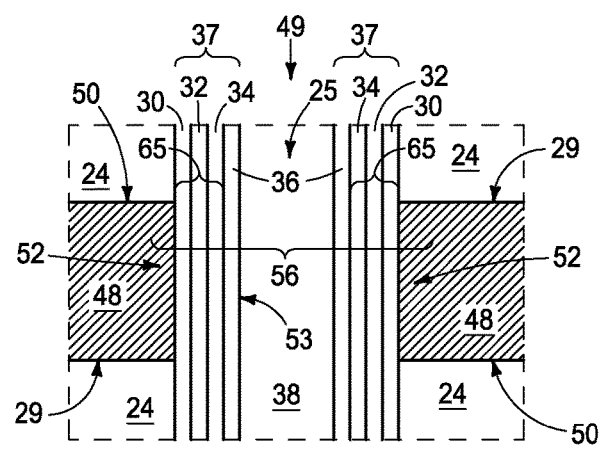
FIG. 40

US 11,282,847 B2

METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 3-40 are diagrammatic sequential sectional, expanded, enlarged, and/or partial views of the construction of FIGS. 1 and 2, or portions thereof, in process in accordance with some embodiments of the invention.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. First example method embodiments are described with reference to FIGS. 1-40 which may be considered as a "gate-last" or "replacement-gate" process, and starting with FIGS. 1 and 2.

Figure 1:
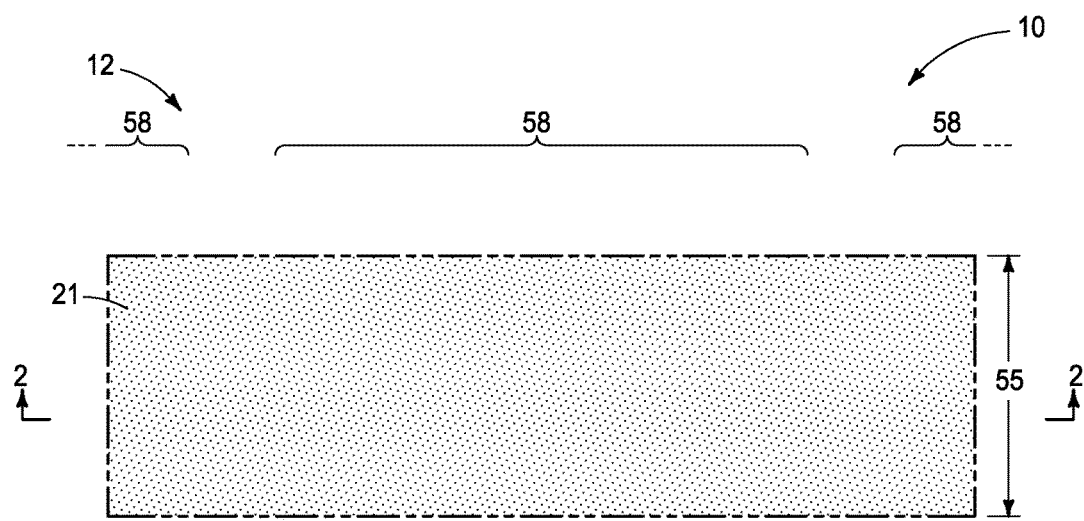
FIG. 1 is a diagrammatic cross-sectional view of a portion of a substrate in process in accordance with an embodiment of the invention and is taken through line 1-1 in FIG. 2.
Figure 2:
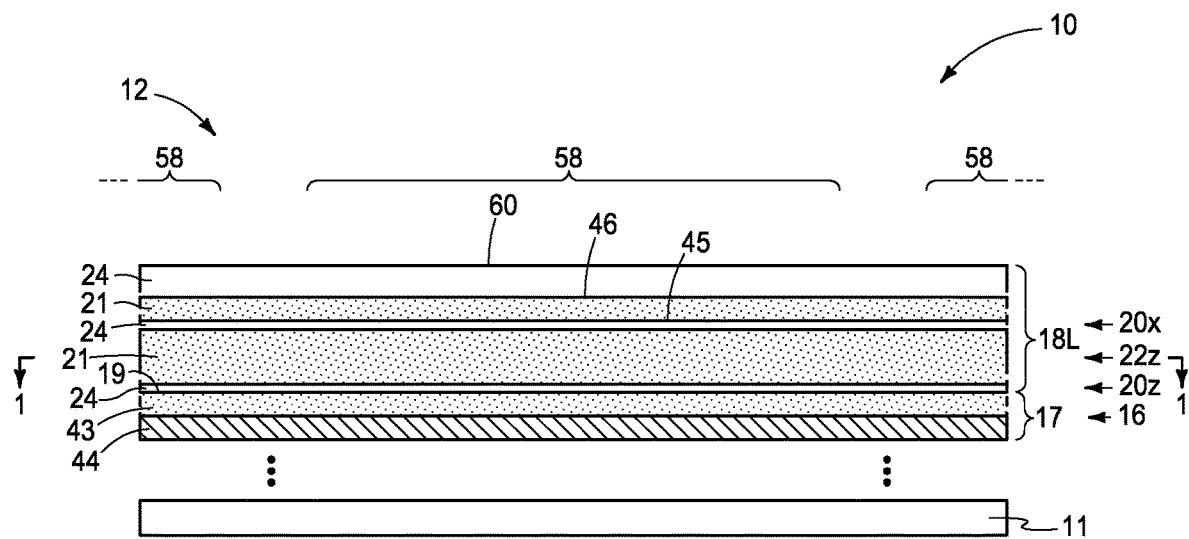
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments and as shown, a conductor tier 16 comprising conductor material 17 having an uppermost surface 19 has been formed above substrate 11. In one embodiment, conductor material 17 comprises upper conductor material 43 (e.g., n-type or p-type conductively-doped polysilicon) directly above (e.g., directly against) lower conductor material 44 (e.g., $WSi_x$) of different composition from upper conductor material 43. Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 when present (an * being used as a suffix to be inclusive of all such same-numerically-designated components that may or may not have other suffixes). Stack 18* will comprise vertically-alternating conductive tiers 22* and insulative tiers 20*, with material of conductive tiers 22* being of different composition from material of second tiers 20*. Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment and as shown, lower portion 18L comprises a lowest 20z of second tiers 20* directly above (e.g., directly against) conductor material 17 material. A lowest tier 22z of first tiers 22* is directly above (e.g., directly against) lowest second tier 20z and comprises first sacrificial material 21 (e.g., doped or undoped polysilicon, or silicon nitride). A first layer 45 of second-tier material 24 (e.g., silicon dioxide) is directly above (e.g., directly against) lowest first tier 22z. A second layer 46 (e.g., material 21) of different composition from first layer 45 is directly above (e.g., directly against) first layer 45. Lowest first tier 22z is thicker than second layer 46. A third layer 60 (e.g., material 24) of different composition from second layer 46 is directly above (e.g., directly against) second layer 46.

Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Figure 3:
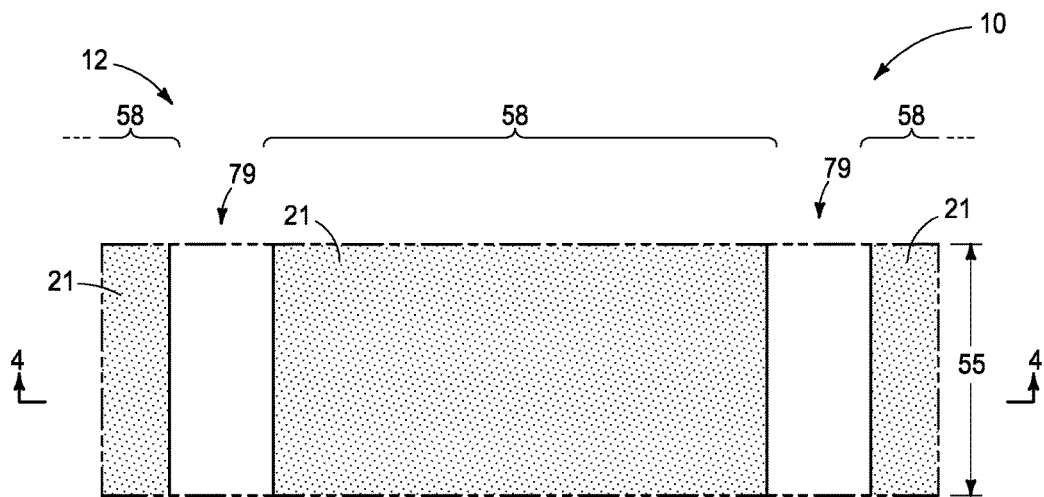
Figure 4:
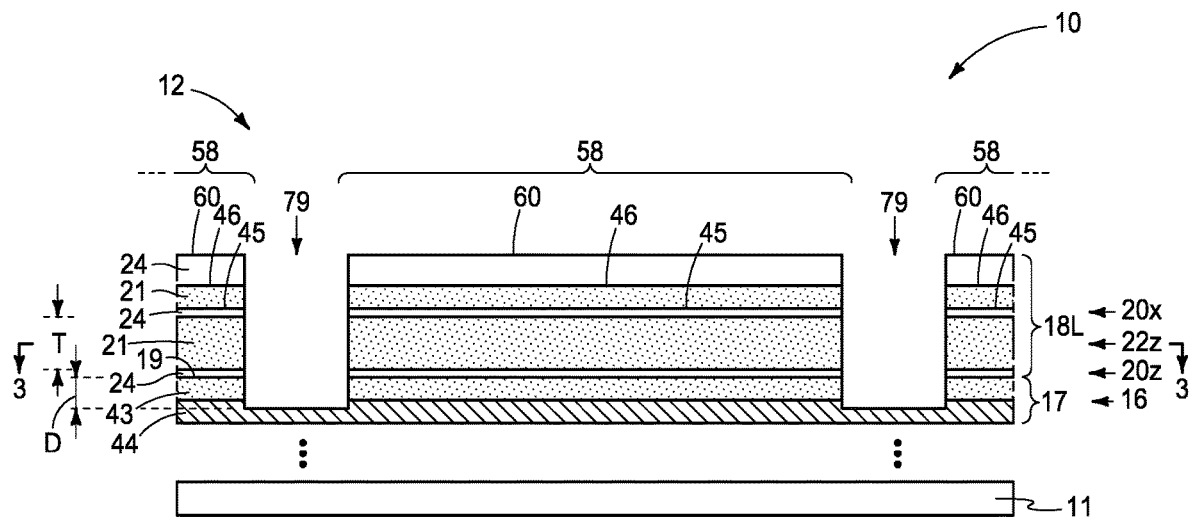
Figure 5:
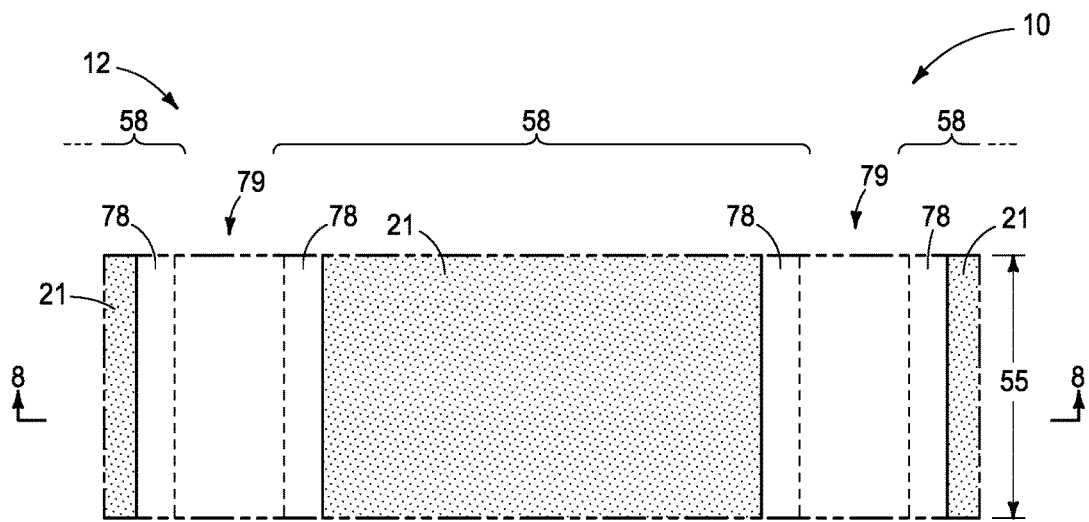
Figure 6:
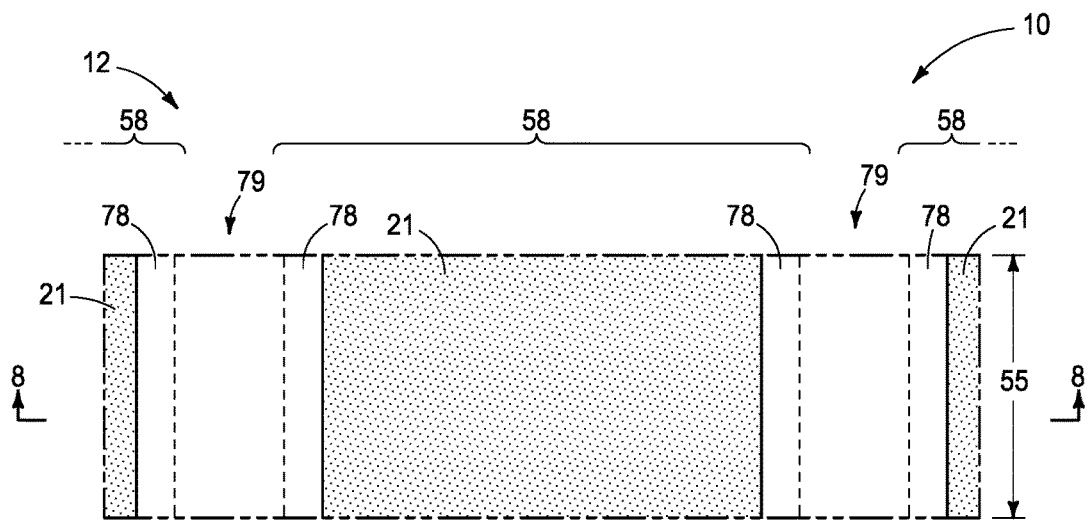
Figure 7:
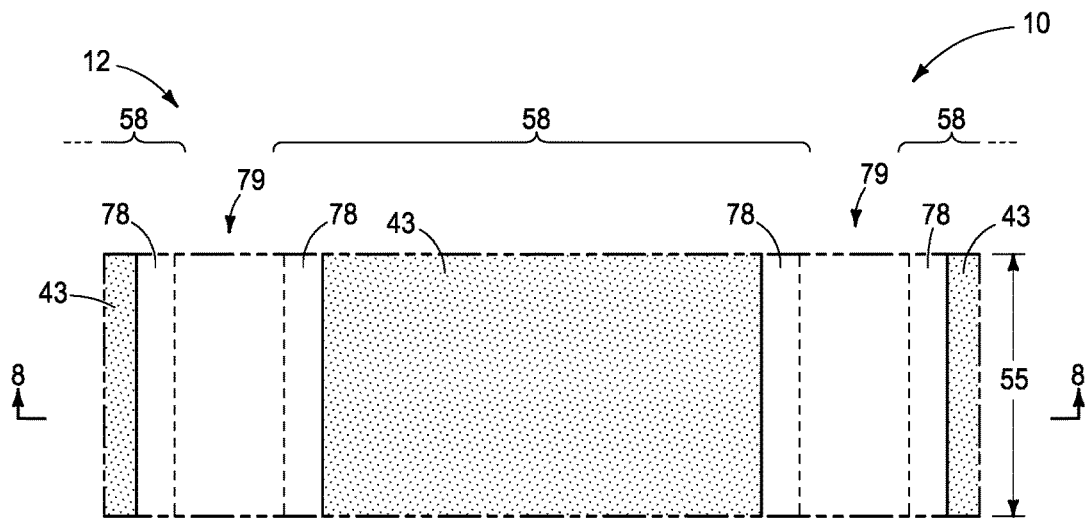
Figure 8:
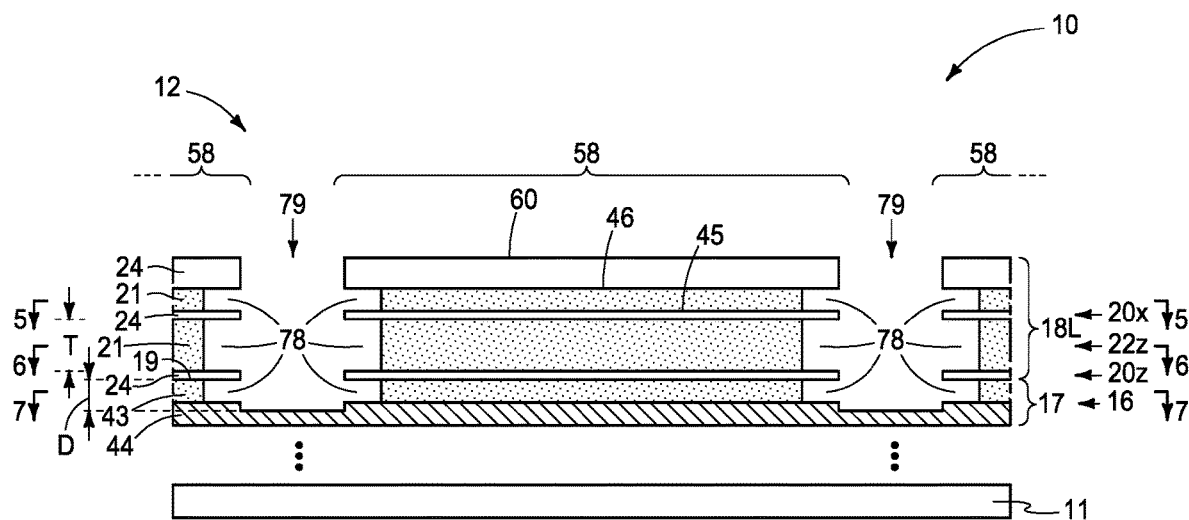

Referring to FIGS. 3 and 4, horizontally-elongated troughs 79 have been formed in lower portion 18L and extend through third layer 60, second layer 46, first layer 45, lowest first tier 22z, lowest second tier 20z, and into conductor material 17. Troughs 79 extend into conductor material 17 to a depth D that is less than a thickness T of lowest first tier 22z. In one embodiment and as shown, lowest first tier 22z is thicker than upper conductor material 43 and horizontally-elongated troughs 79 are formed through upper conductor material 43 to extend to lower conductor material 44 (e.g., into conductor material 44 as shown).

Referring to FIGS. 5-8, conductor material 17 (e.g., upper conductor material 43), first sacrificial material 21 of lowest first tier 22z, and second layer 46 have been laterally recessed selectively relative to lowest second tier 20z, first layer 45, and third layer 60 to form laterally-opposed recesses 78 longitudinally-along individual troughs 79 in conductor material 17, in first sacrificial material 21 of lowest first tier 22z, and in second layer 46. In one embodiment, such act or acts of laterally recessing comprises isotropic etching of conductor material 17, first sacrificial material 21 of lowest first tier 22z, and second layer 46. In one such embodiment where conductor material 17 (e.g., upper conductor material 43), first sacrificial material 21 of lowest first tier 22z, and second layer 46 comprise the same composition relative one another, such isotropic etching thereof may occur simultaneously. For example, where material 21 (and 43, in one embodiment) comprise polysilicon and other exposed materials comprise silicon dioxide and $WSi_x$, an example isotropic etching chemistry to produce the construction of FIGS. 5-8 from that of FIGS. 3 and 4 is tetramethyl ammonium hydroxide (TMAH). In one embodiment, only two of conductor material 17, first sacrificial material 21 of lowest first tier 22z, and second layer 46 are of the same composition relative one another, and the isotropic etching thereof may not occur simultaneously. In one embodiment, none of conductor material 17, first sacrificial material 21 of lowest first tier 22z, and second layer 46 are of the same composition relative one another, and the isotropic etching thereof may not occur simultaneously. Regardless and in one embodiment and as shown, such laterally recessing has also laterally recessed upper conductor material 43 selectively relative to lower conductor material 44 to form laterally-opposed recesses 78 in conductor material 17 to be in upper conductor material 43.

Figure 9:
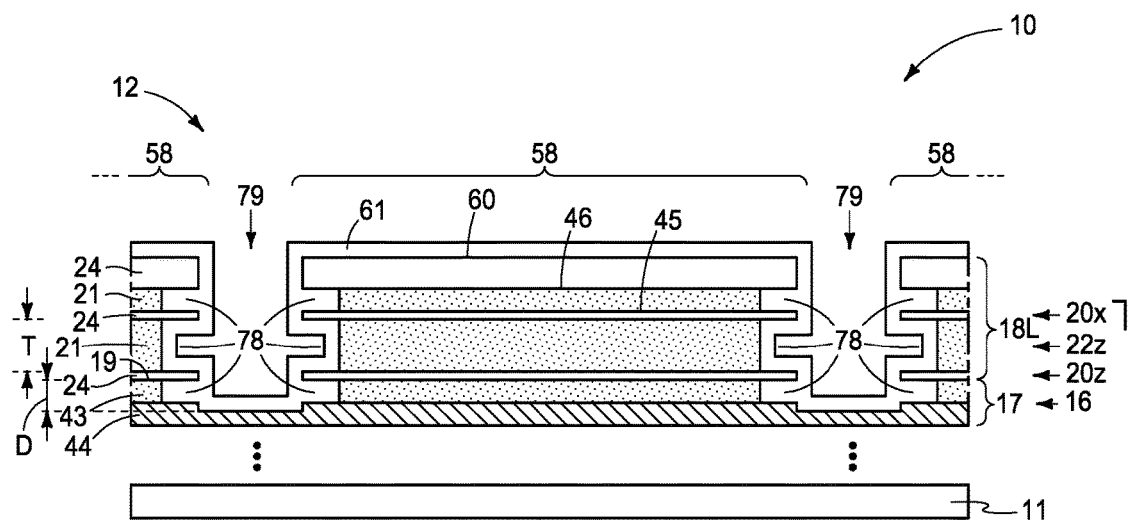
Figure 10:
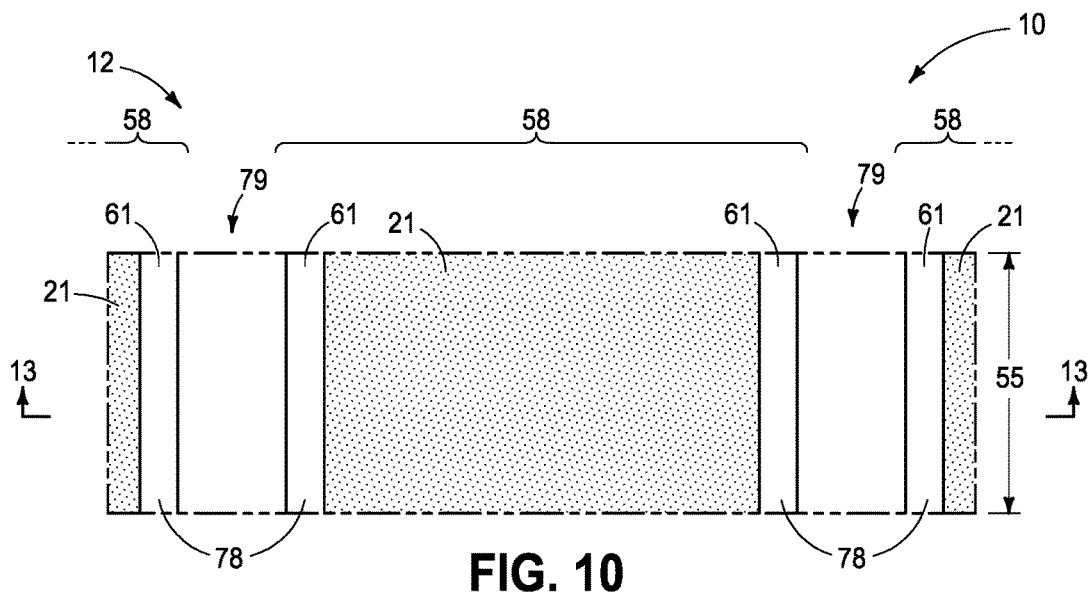
Figure 11:
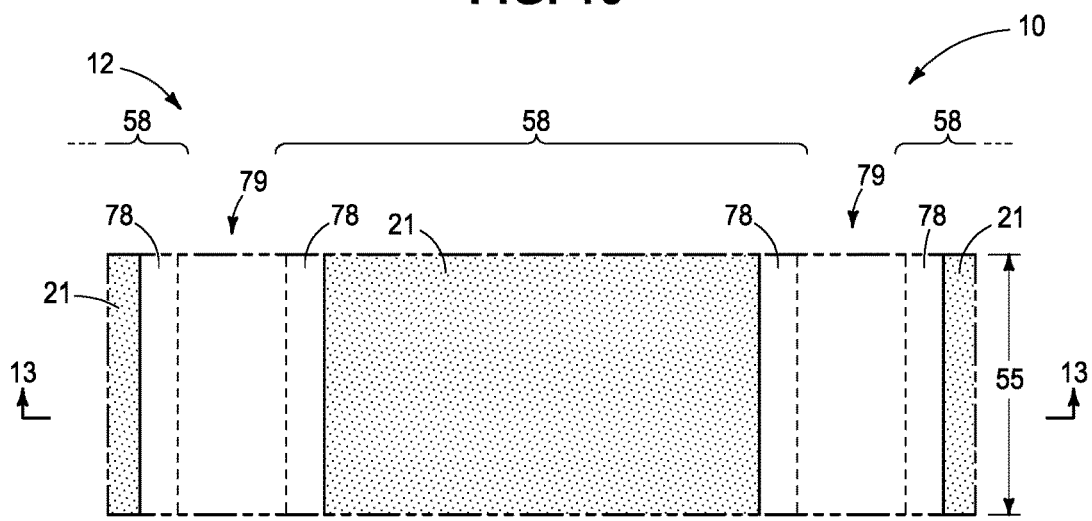
Figure 12:
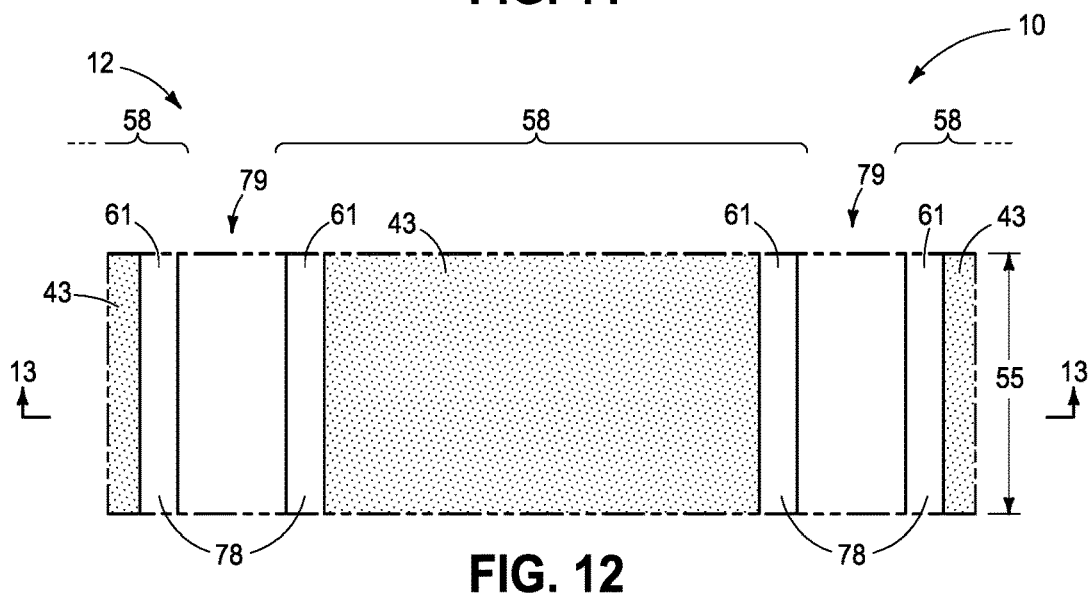
Figure 13:
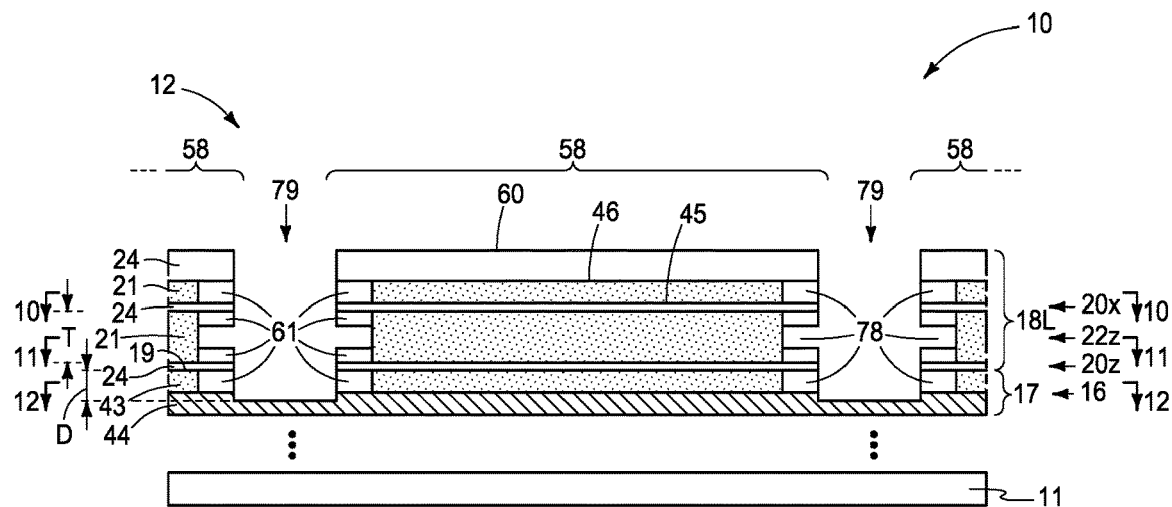

Referring to FIG. 9, insulating material 61 (e.g., silicon dioxide) has been deposited along sidewalls of troughs 79 and into recesses 78. Insulating material 61 fills recesses 78 in conductor material 17 and recesses 78 in second layer 46. Insulating material 61 less-than-fills recesses 78 in lowest first tier 22z.

Referring to FIGS. 10-13, insulating material 61 has been removed (e.g., by isotropic etching thereof) from recesses 78 in lowest first tier 22z while leaving insulating material 61 in recesses 78 in conductor material 17 and in recesses 78 in second layer 46.

Figure 14:
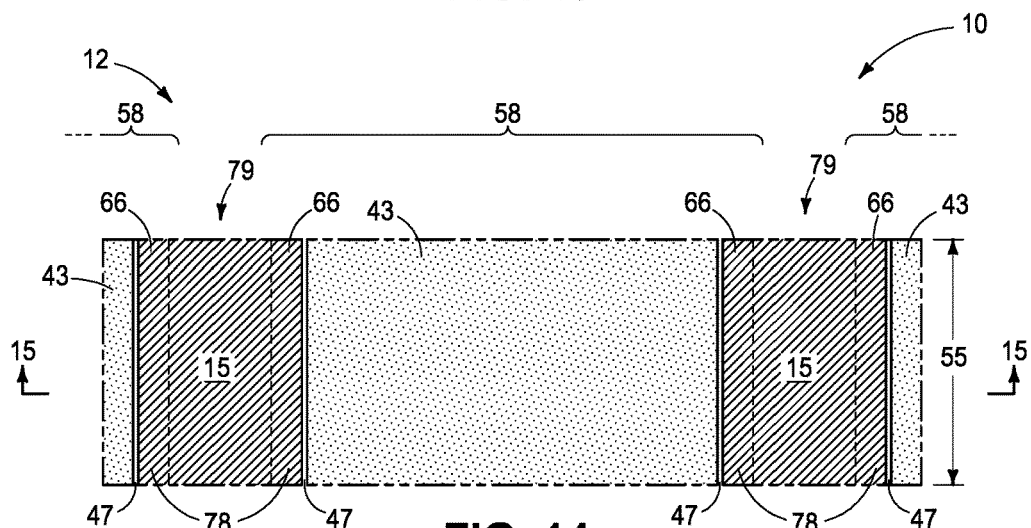
Figure 15:
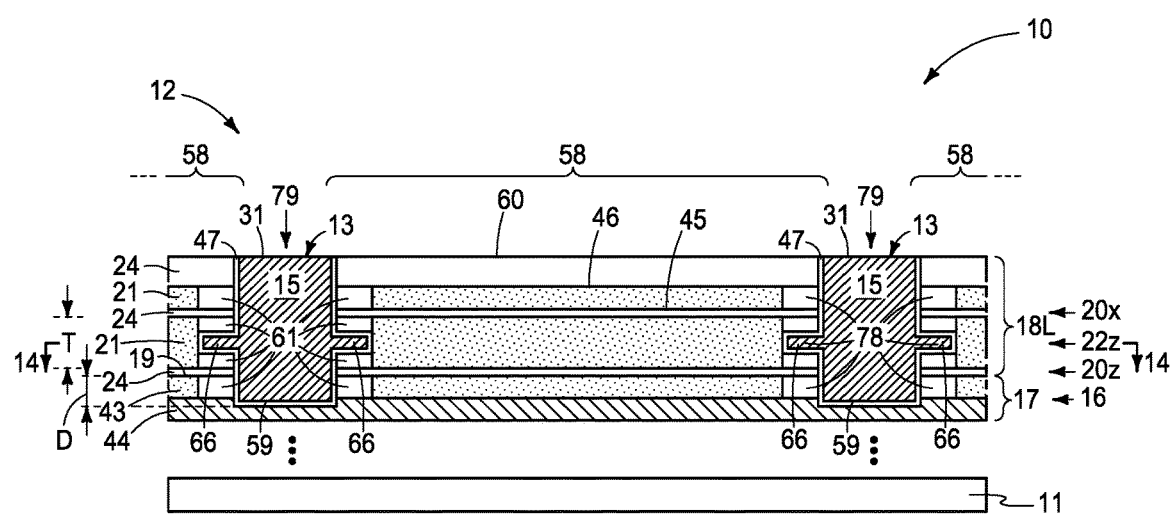
Figure 16:
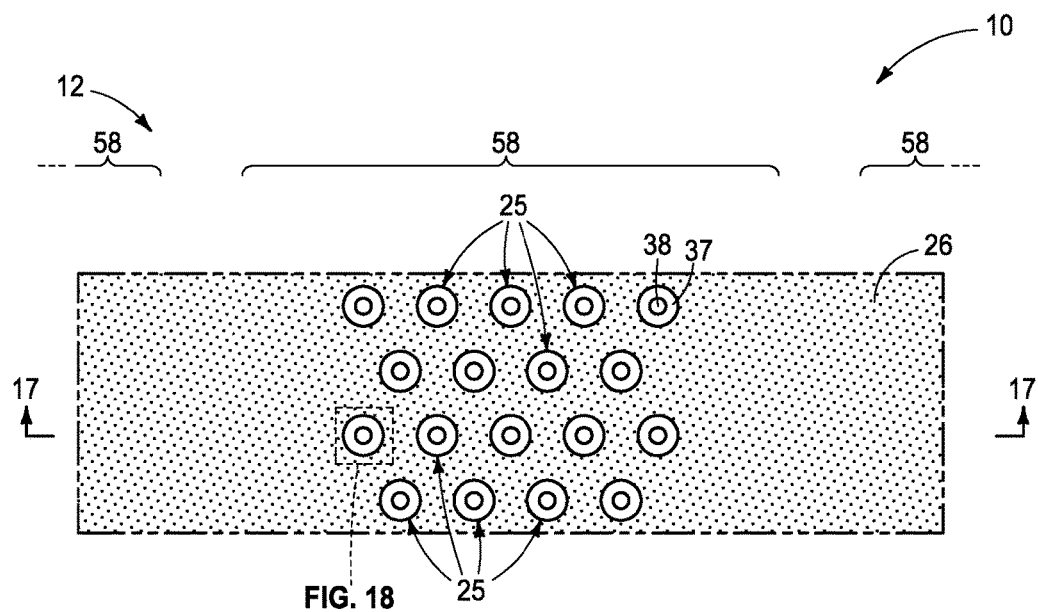
Figure 17:
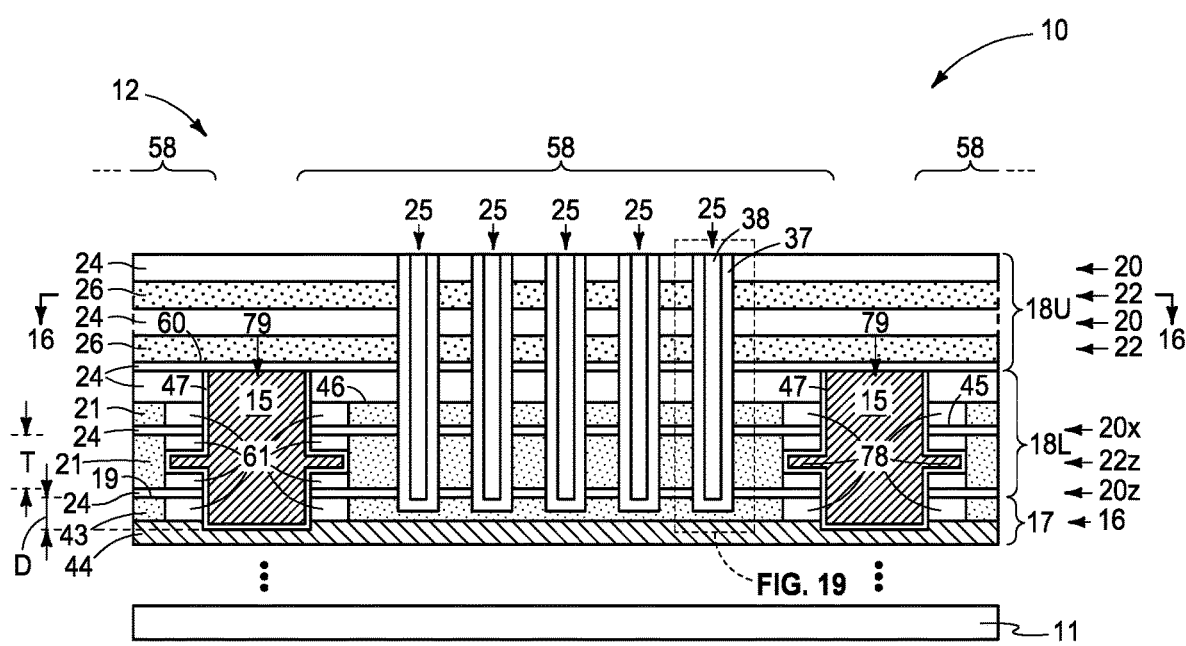
Figure 18:
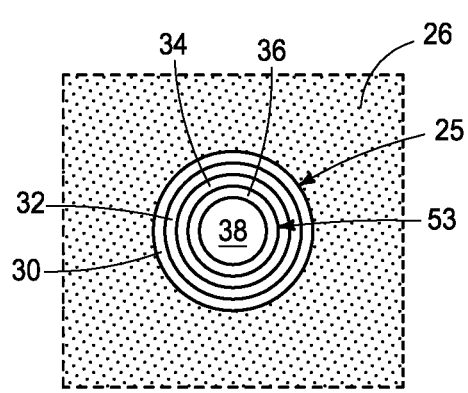
Figure 19:
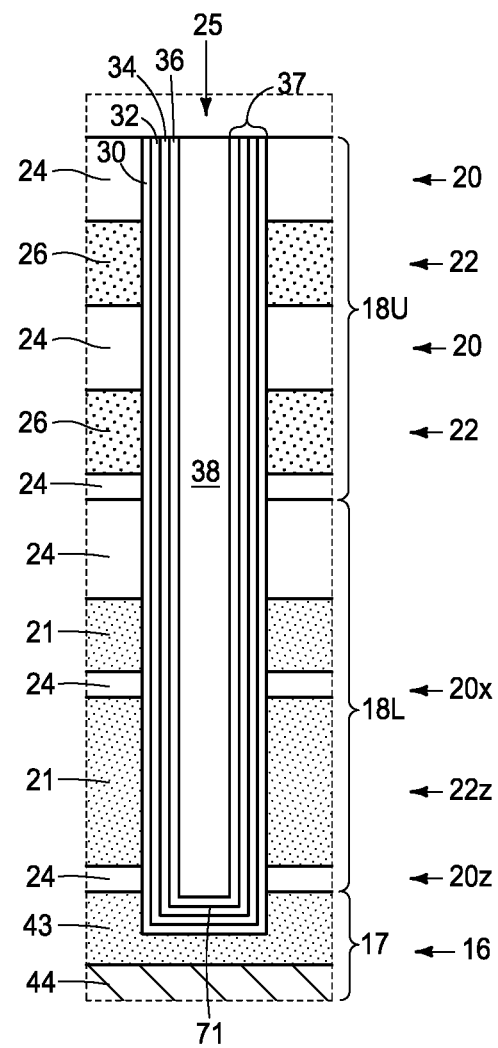

Referring to FIGS. 14 and 15, horizontally-elongated lines 13 have been formed in troughs 79 and are individually between immediately-laterally-adjacent memory-block regions 58. Lines 13 individually comprise laterally-opposing projections 66 longitudinally there-along that are in laterally-opposed recesses 78 in lowest first tier 22z. Lines 13 comprise second sacrificial material 15 of different composition from first sacrificial material 21. In one embodiment, second sacrificial material 15 comprises metal material, for example elemental tungsten above a thin layer of TiN. An optional insulative liner 47 (e.g., silicon dioxide) has been formed in troughs 79 and recesses 78 prior to forming material 15 of lines 13, and in one such embodiment at least a portion of insulative liner is in a finished circuitry construction. In one embodiment, second sacrificial material 15 of individual lines 13 may extend laterally into respective immediately-laterally-adjacent memory-block regions 58, for example as shown occurs by example lateral projections 66. In one embodiment, lines 13 individually comprise an uppermost surface 31 that is above lowest first tier 22z. In one embodiment, lines 13 individually comprise a bottom surface 59 that is not directly against conductor material 17

(e.g., due to presence of insulative liner 47). Lines 13 may taper laterally-inward (not shown) moving deeper into lower stack portion 18L.

Referring to FIGS. 6-19, vertically-alternating first tiers 22* and second tiers 20* of an upper portion 18U of stack 18* have been formed above lower portion 18L and lines 13. Example conductive tiers 22* comprise first material 26 (e.g., silicon nitride if gate-last processing) which may be wholly or partially sacrificial. Example insulative tiers 20* comprise second material 24 that is of different composition from that of first material 26 and which may be wholly or partially sacrificial. Example thickness for each of tiers 20* and 22* is 20 to 60 nanometers. Only a small number of tiers 20* and 22* is shown, with more likely stack 18U (and thereby stack 18*) comprising dozens, a hundred or more, etc. of tiers 20* and 22*. Further, other circuitry that may or may not be part of peripheral and/or control circuitry may be between conductor tier 16 and stack 18*. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through insulative tiers 20* and conductive tiers 22* in upper portion 18U to lowest first tier 22z in lower portion 18U and to conductor tier 16 as shown. By way of example and for brevity only, channel openings 25 are shown as being arranged in groups or columns of staggered rows of four and five channel openings 25 per row. Channel openings 25 may taper radially-inward (not shown) moving deeper in stack 18*. In some embodiments, channel openings 25 may go into conductor material 17 of conductor tier 16 as shown or may stop there-atop (not shown). Alternately, as an example, channel openings 25 may stop atop or within lowest insulative tier 20z or lowest first tier 22z. A reason for extending channel openings 25 ultimately at least to or into conductor material 17 of conductor tier 16 is to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Transistor channel material 36 has been formed in individual channel openings 25 elevationally along the first tiers and the second tiers, thus comprising individual channel-material strings 53 that extend through first tiers 22* and second tiers 20* in upper portion 18U to lowest first tier 22z in lower portion 18L. Channel material 36 in channel-material strings 53 will be directly electrically coupled with conductor material 17 in conductor tier 16. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material. FIGS. 16-19 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 may be considered as having a lowest surface 71 thereof. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 16 and 17 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Prior to forming channel openings 25, sacrificial pillars (not shown) may have been formed in lower stack portion 18L and would be horizontally-located (i.e., in x, y coordinates) where individual channel openings 25 will be formed. Channel openings 25 would then be formed to such sacrificial pillars and which would then be removed to thereby effectively extend channel openings 25 into lowest first tier 22z before forming materials 37 and 38.

Figure 20:
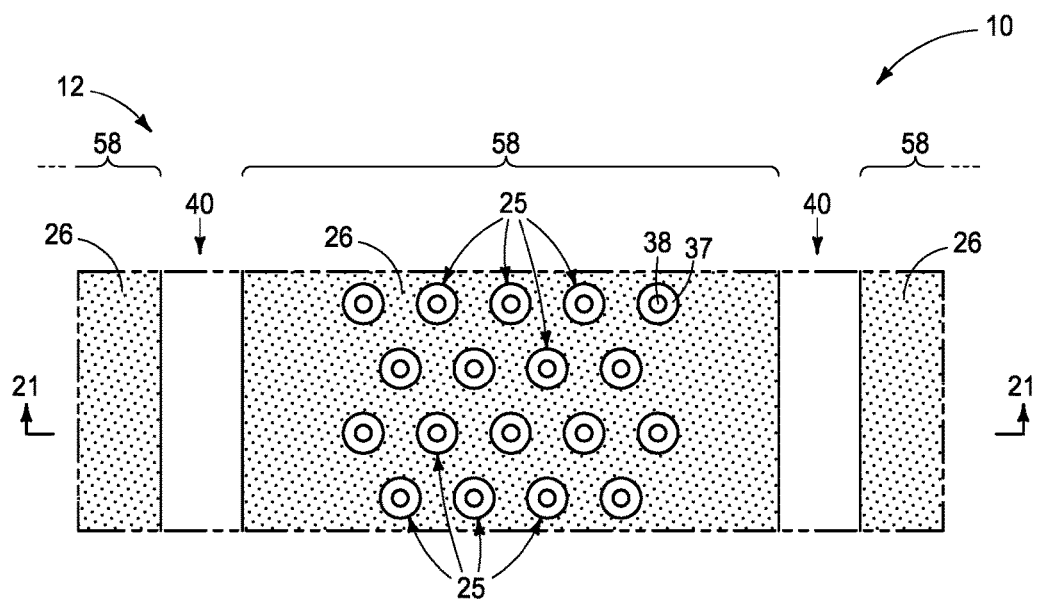
Figure 21:
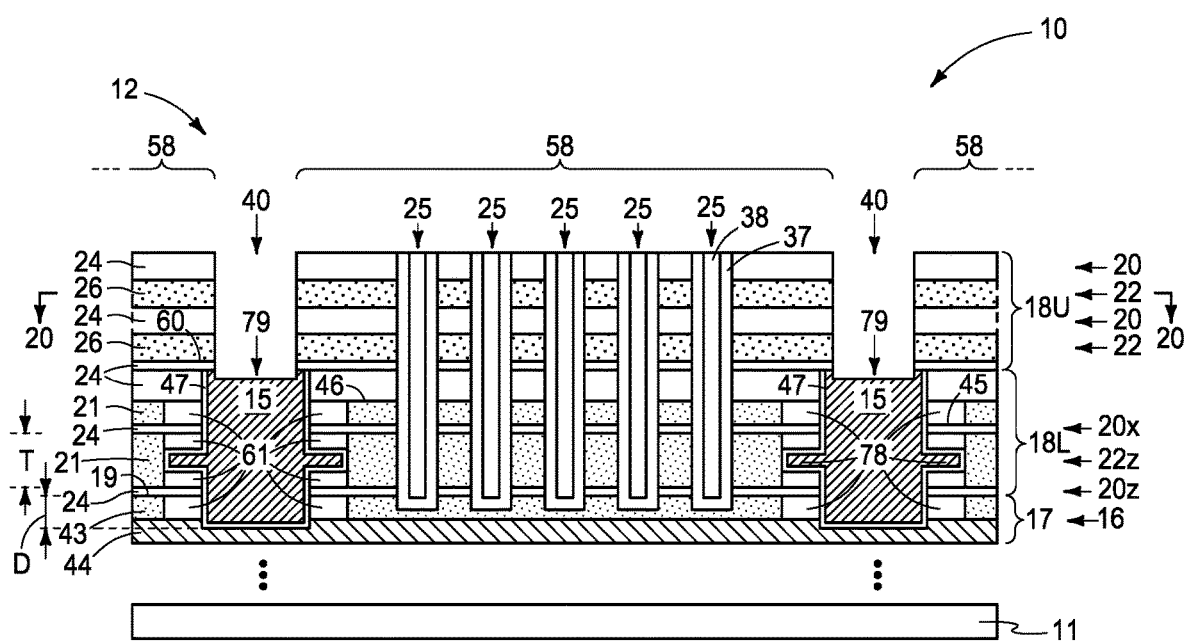
Figure 22:
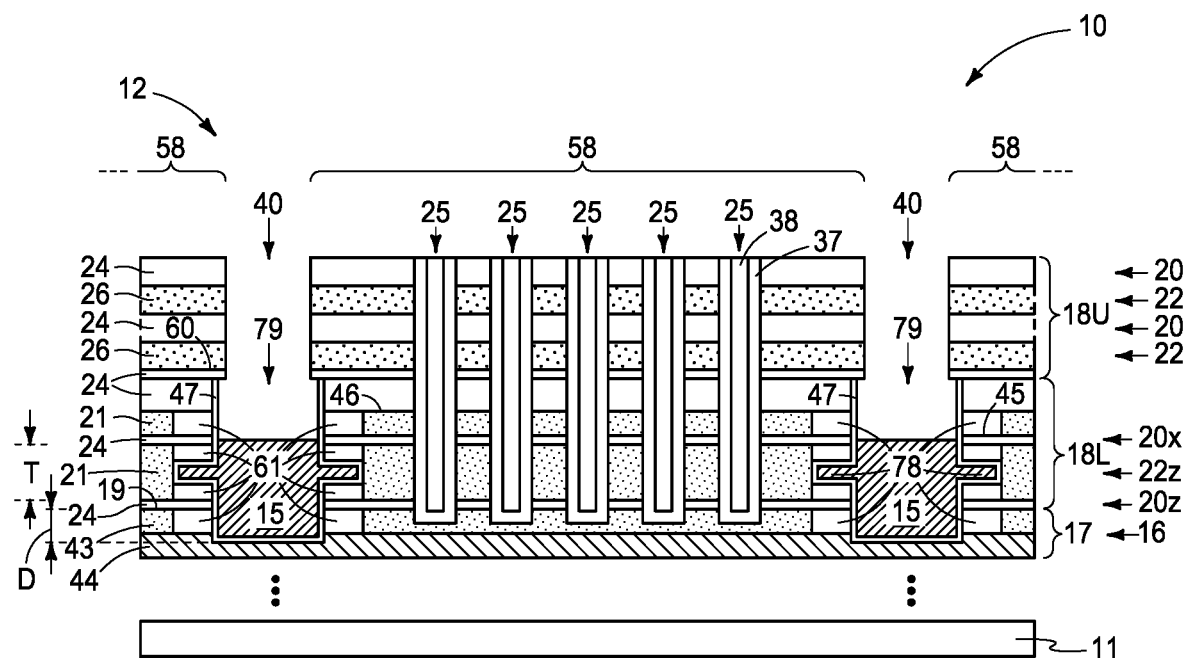

Referring to FIGS. 20 and 21, horizontally-elongated trenches 40 have been formed into stack 18* (e.g., by anisotropic etching) and are individually between immediately-laterally-adjacent memory-block regions 58 and extend to line 13 there-between. In one embodiment, trenches 40 extend vertically into second sacrificial material 15 of lines 13. FIG. 22 shows optional additional vertical etching (e.g., isotropically; see below for an example chemistry) of second sacrificial material 15.

Figure 23:
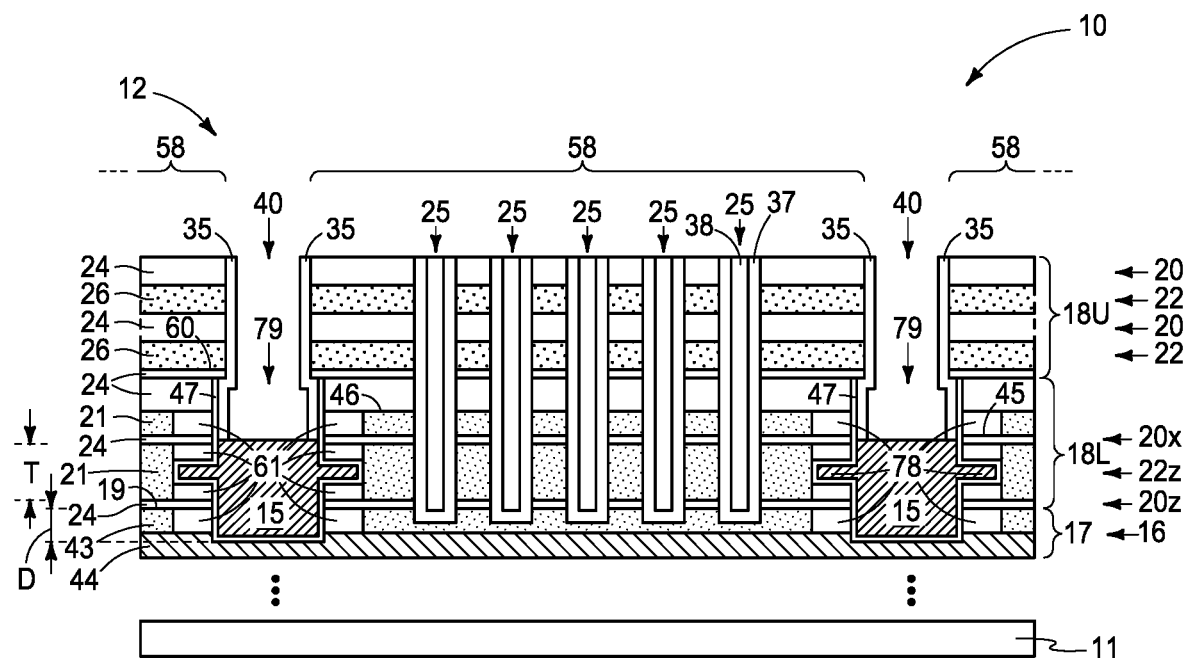

Referring to FIG. 23, and in one embodiment, lining material 35 (e.g., doped or undoped polysilicon or silicon dioxide) has been formed to cover sidewalls and bases of trenches 40 and thereafter has been removed from covering the trench bases (e.g., by maskless anisotropic spacer-like etching) to re-expose second sacrificial material 15.

Figure 24:
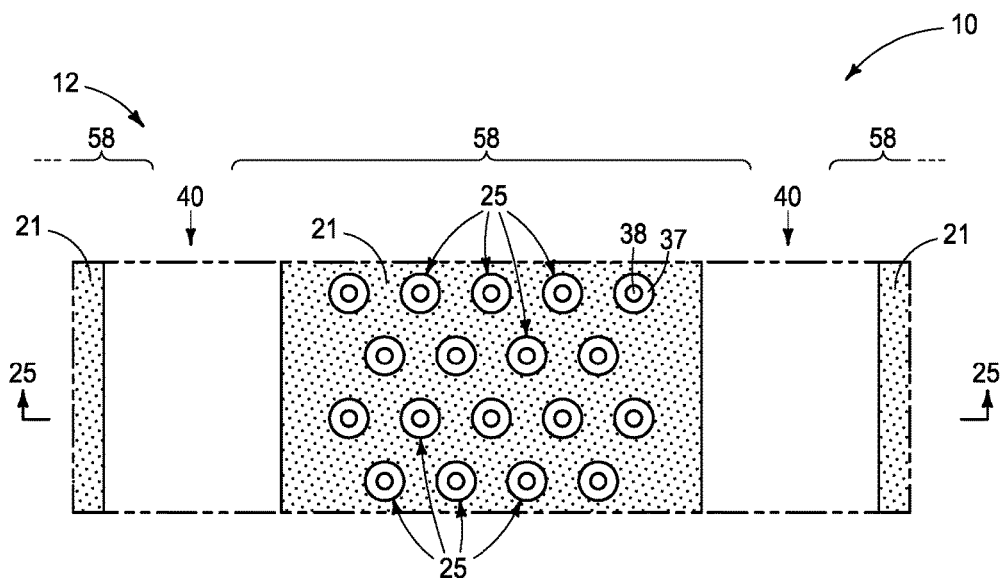
Figure 25:
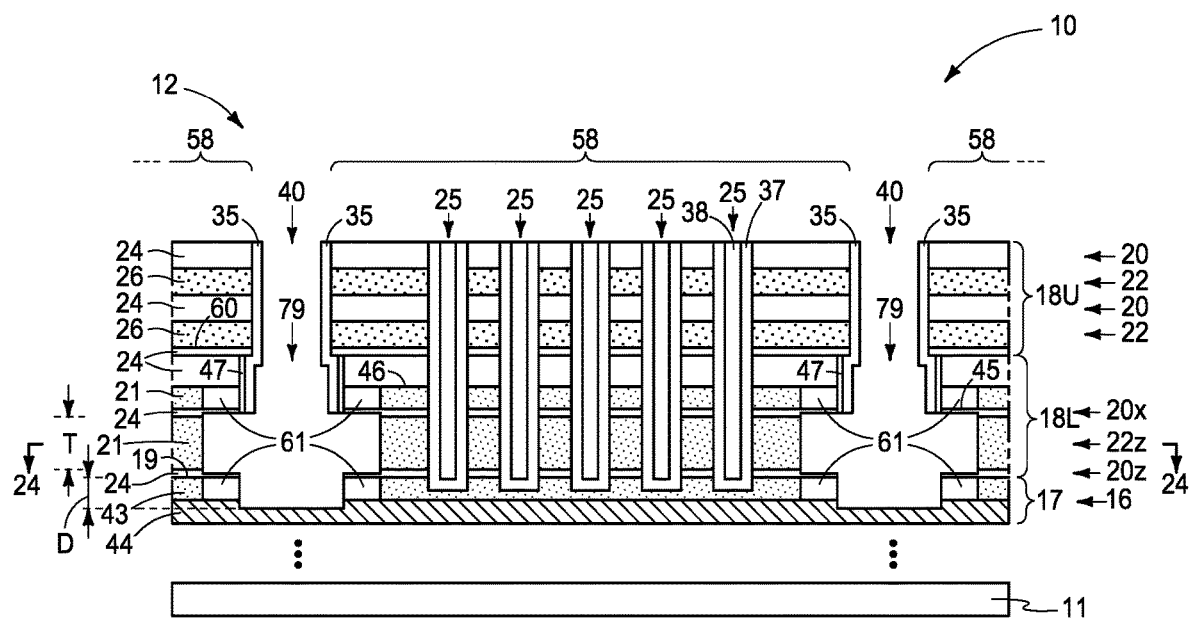

Referring to FIGS. 24 and 25, second sacrificial material 15 (not shown) of lines 13 (not shown) and projections 66 (not shown) has been removed (e.g., by selective isotropic etching) through trenches 40. Portions of optional liner 47 that are not masked by lining material 35 have also been removed (e.g., using HF when silicon dioxide). In one embodiment, first sacrificial material 21 in lowest first tier 22z has been exposed. The artisan is capable of selecting a suitable isotropic etching chemistry that will etch second sacrificial material 15 selectively relative to other exposed materials. As an example, a W material 15 can be isotropically etched selectively relative to $SiO_2$ and $Si_3N_4$ using a mixture of ammonia and hydrogen peroxide or a mixture of sulfuric acid and hydrogen peroxide.

Figure 26:
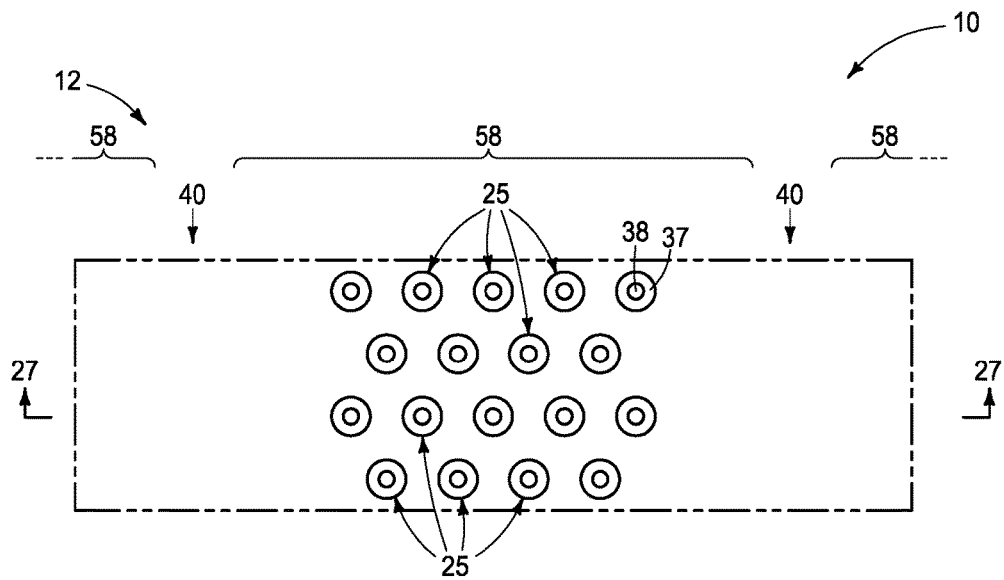
Figure 27:
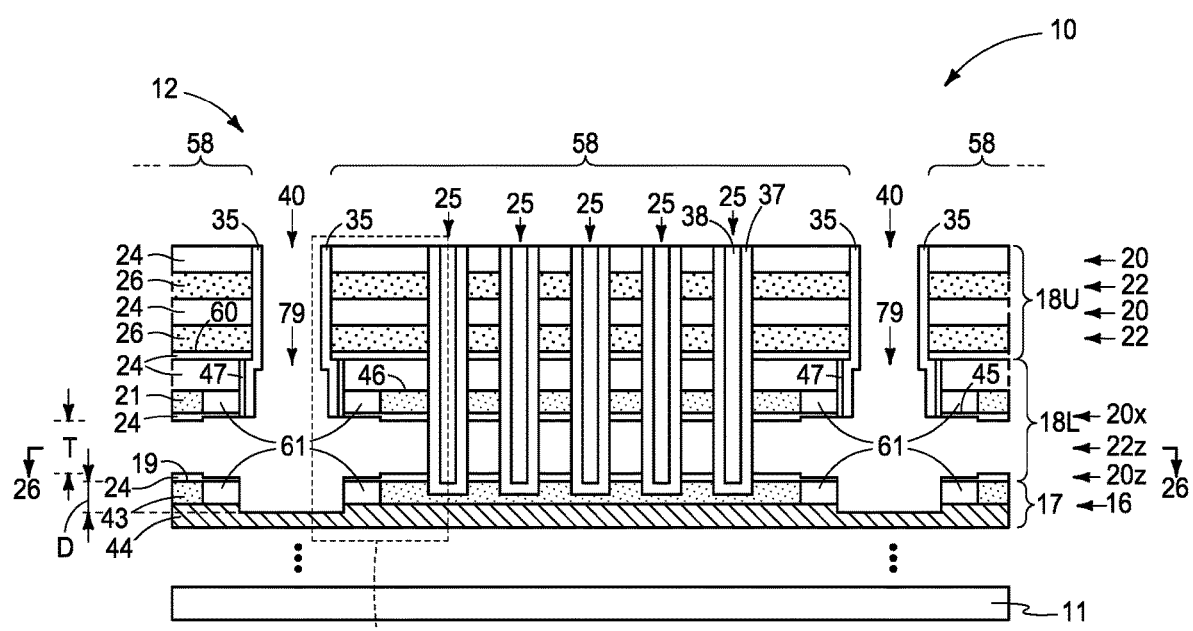
Figure 28:
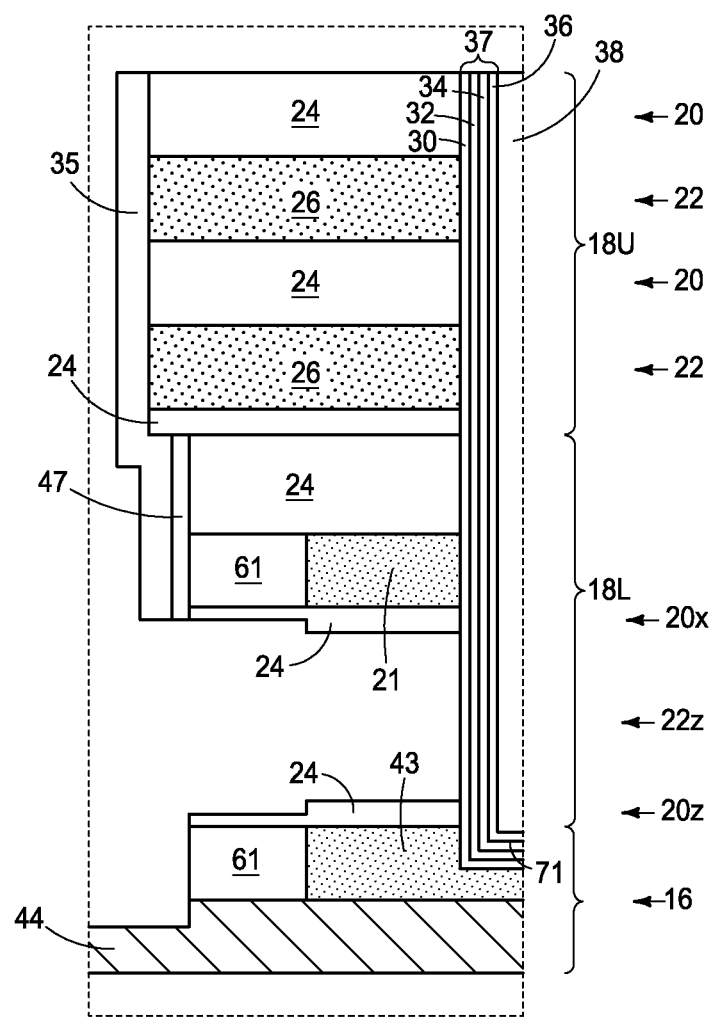

Referring to FIGS. 26-28, exposed first sacrificial material 21 in lowest first tier 22z (not shown in 22z) has been isotropically etched therefrom through trenches 40, for example selectively relative to other exposed materials. The artisan is capable of selecting one or more suitable etching chemistries (e.g., using liquid or vapor $H_3PO_4$ as a primary etchant where material 21 is silicon nitride and exposed other materials comprise one or more oxides or polysilicon or using TMAH where material 21 is polysilicon).

Figure 29:
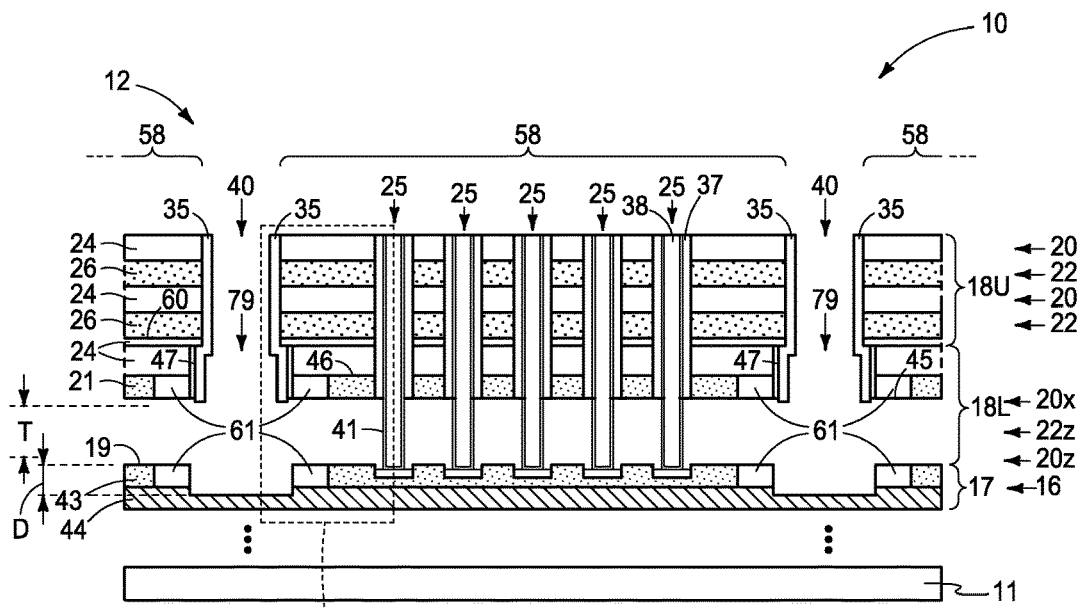
Figure 30:
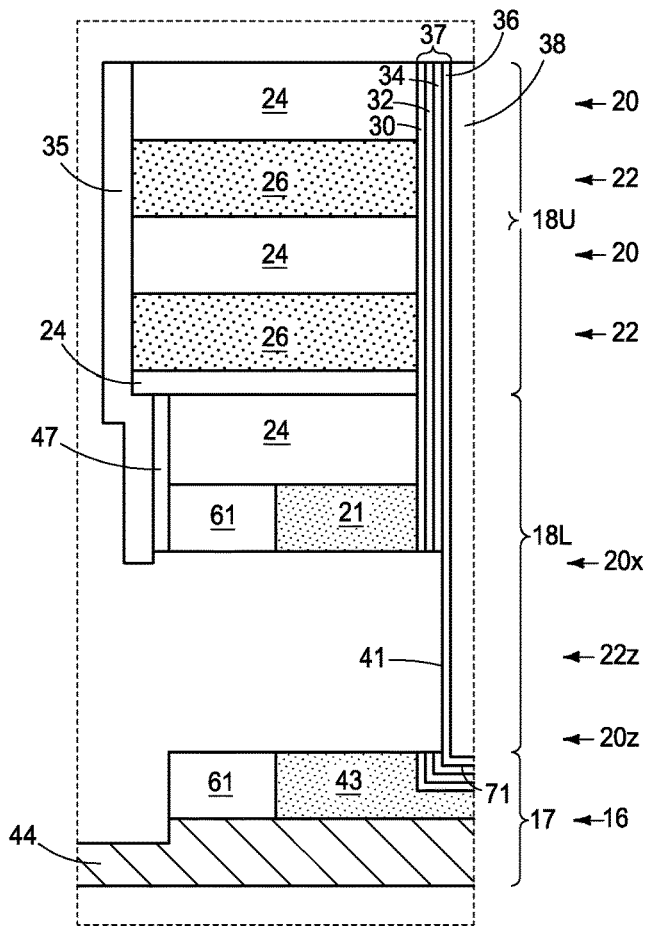

In one embodiment, a sidewall of the channel material of the channel-material strings in the lowest first tier is exposed. FIGS. 29 and 30 show example such subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in each of tiers 20z and 20x to expose a sidewall 41 of channel material 36 of channel-material strings 53 in lowest first tier 22z. Any of materials 30, 32, and 34 in tier 20z may be considered as being sacrificial material therein. As an example, consider an embodiment where materials 21, 36, and 43 are polysilicon, materials 24 and 47 are silicon dioxide, and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 29 and 30. The artisan is capable of selecting other chemistries for etching other different materials where a construction as shown in FIGS. 29 and 30 is desired.

Figure 31:
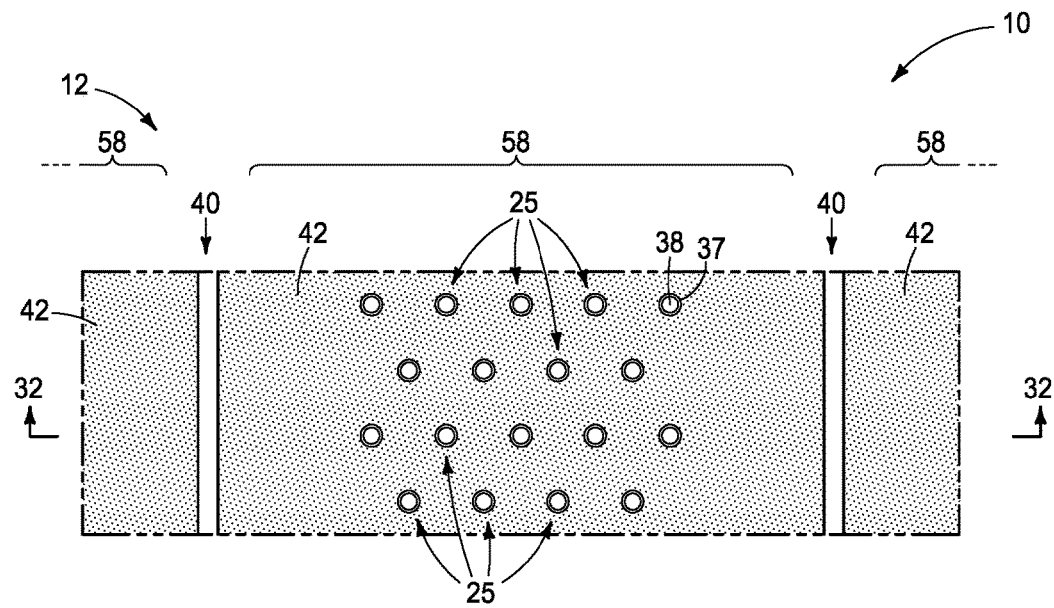
Figure 32:
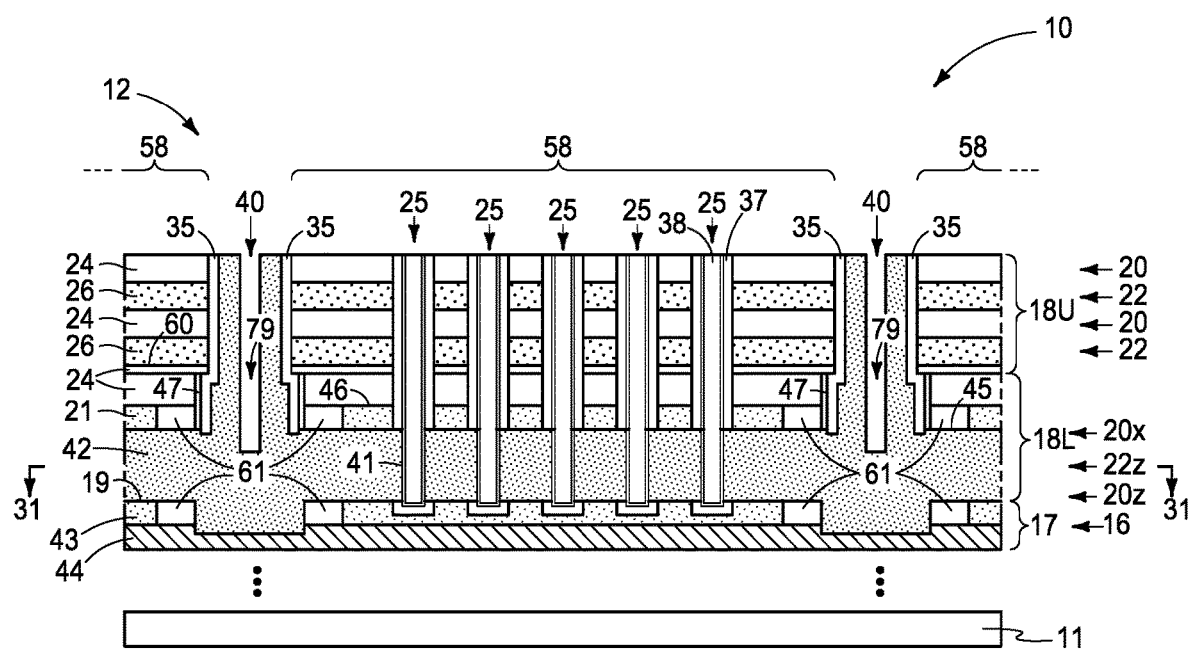

Referring to FIGS. 31 and 32, and in one embodiment, conductive/conducting material 42 has been deposited into void-space in lowest first tier 22z left as a result of removing first sacrificial material 21. In one such embodiment, conductive material 42 is directly against exposed sidewall 41 of the channel material 36 of channel-material strings 53 in lowest first tier 22z and in one embodiment is directly against an uppermost surface 19 of conductor material 17 (e.g., upper conductor material 43) of conductor tier 16. Such is but one example whereby conductive material 42 has been deposited to directly electrically couple together channel material 36 of individual channel-material strings 53 and conductor material 17 of conductor tier 16 (e.g., through channel-material sidewall 41). Example conductive materials 42 are conductively-doped semiconductor material (e.g., conductively-doped polysilicon) and metal material.

Figure 33:
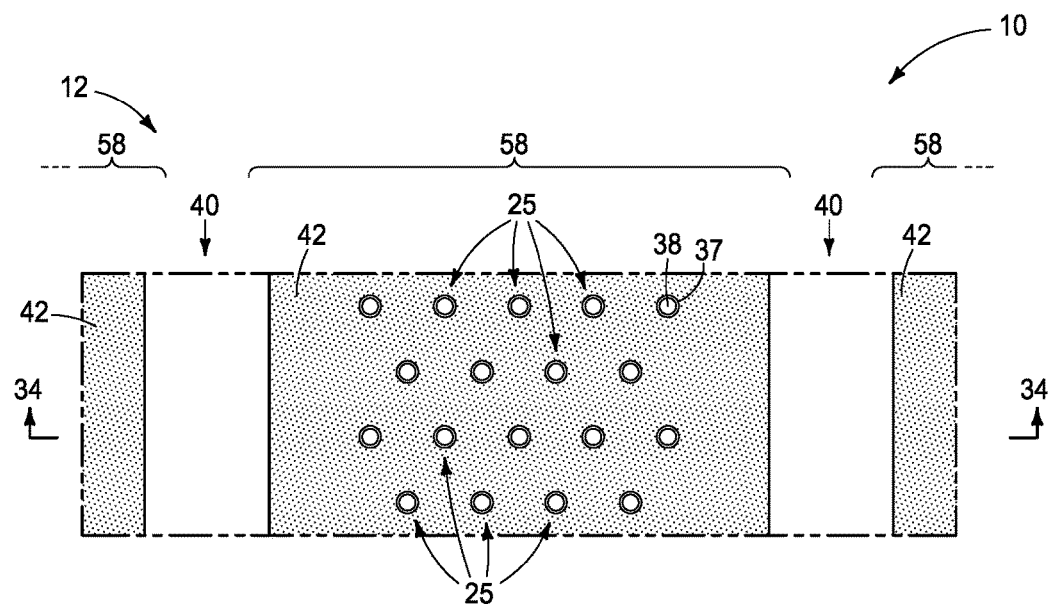
Figure 34:
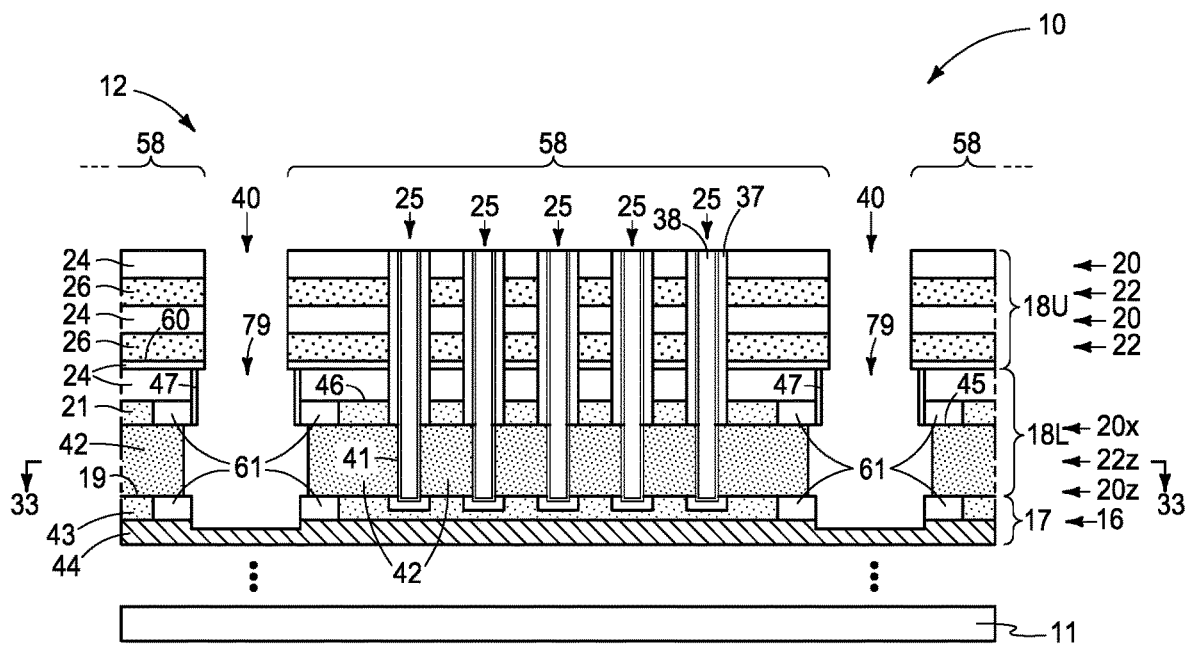
Figure 35:
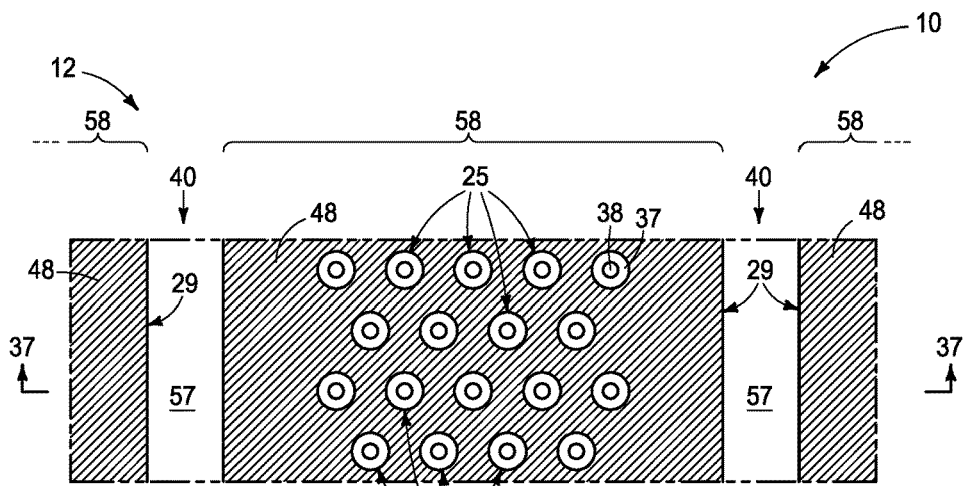
Figure 36:
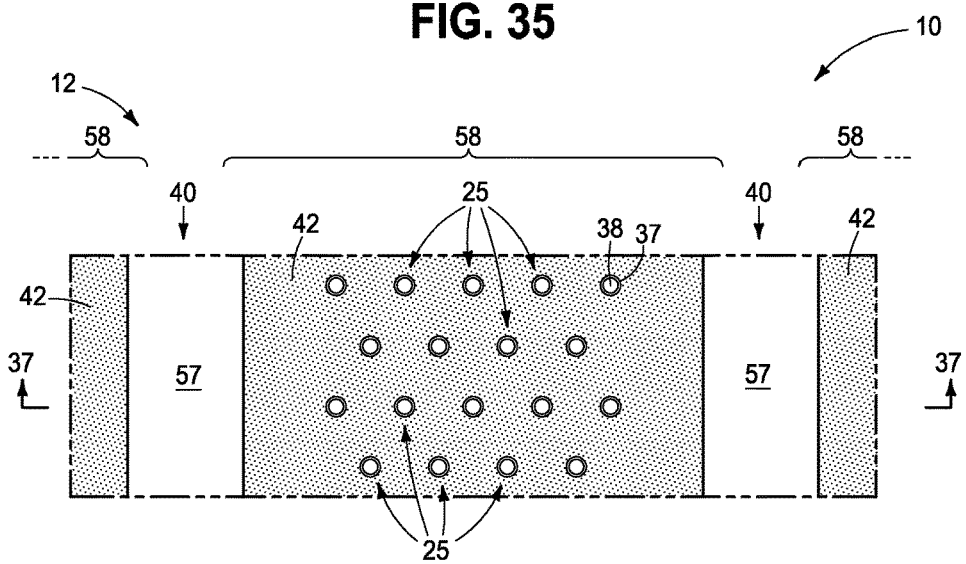
Figure 37:
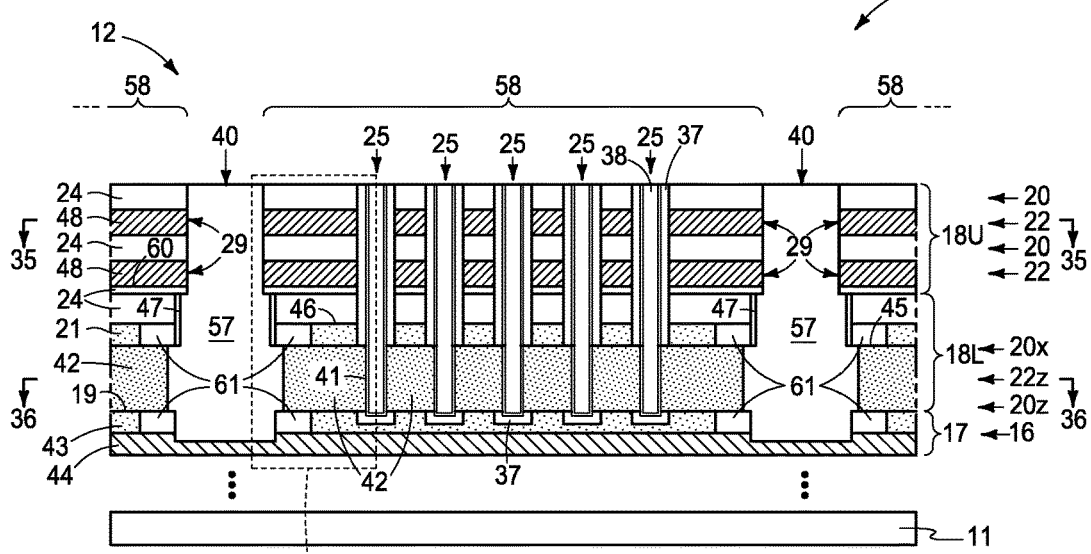

Referring to FIGS. 33 and 34, conductive material 42 has been removed from trenches 40, for example by timed isotropic etching. Such may result in removal of lining material 35 as shown or such may be separately removed. Alternately, lining material 35 may have been removed earlier (not shown). A reason for removing lining material 35 is to provide access to material 26 in first tiers 22 for removal thereof in a replacement gate process. The etching of conductive material 42 may result in some etching of conductor material 17 when exposed (not shown). Example etching chemistries where material 42 is conductively-doped polysilicon, material 24 is silicon dioxide, material 26 is silicon dioxide is HBr (anisotropic) and TMAH (isotropic). An optional selective oxidation may be conducted (not shown) to form an oxide layer (not shown) atop conductor material 17 at bases of trenches 40.

Referring to FIGS. 35-40, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 40 and some with dashed outlines in FIGS. 35, 37, 39, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 40) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, lowest surface 71 of channel material 36 of channel-material strings 53 is never directly against any of conductor material 17 of conductor tier 16.

Intervening material 57 has been formed in trenches 40 and void-spaces left as a result of the removing of second sacrificial material 15 of lines 13, and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown). Some material in trenches 40 formed prior to forming that which is designated as intervening material 57 may remain and thereby comprise part of the intervening material 57.

Any other attribute(s) or aspect(s) as shown and/or described herein with respect to other embodiments may be used in the embodiments shown and described with reference to the above embodiments.

Figure 41:
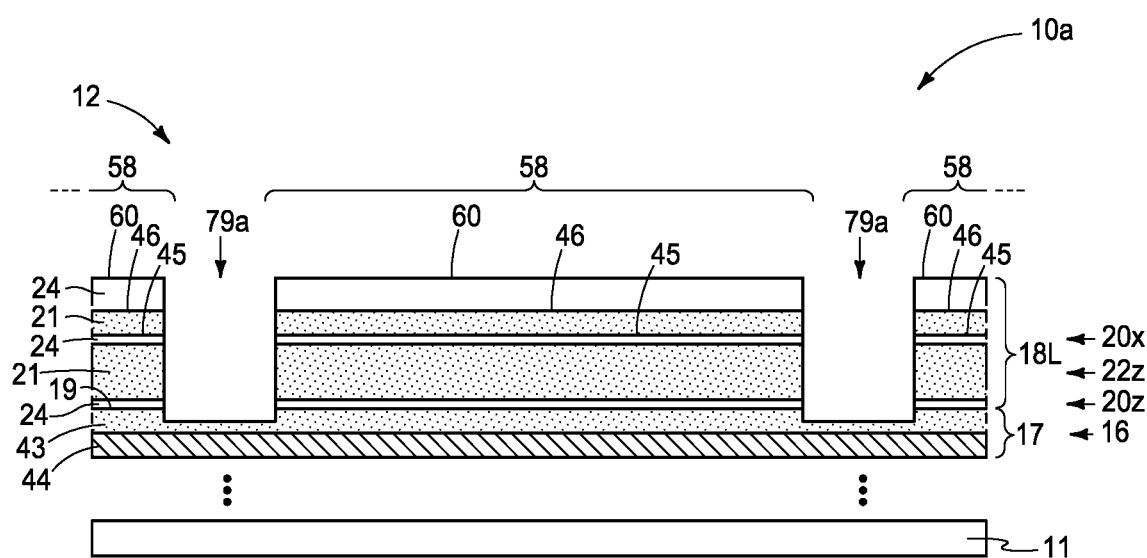
FIG. 41 is a diagrammatic cross-sectional view of a portion of a substrate in process in accordance with an embodiment of the invention.

FIG. 4 shows an embodiment where horizontally-elongated troughs 79 are formed through upper conductor material 43 to extend into conductor material 44. FIG. 41 shows an example alternate embodiment construction 10*a* wherein horizontally-elongated troughs 79*a* are formed to extend only partially into upper conductor material 43. Like numerals from the above-described embodiments have been used where appropriate, with some construction differences being indicated with the suffix "a" or with different numerals. Analogous processing to that shown and described above with respect to FIGS. 5-40 may occur to result in one or more analogous finished constructions such as shown by FIGS. 35-40. Any other attribute(s) or aspect(s) as shown and/or described herein with respect to other embodiments may be used.

In some embodiments, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). A lower portion (e.g., 18L) of a stack (e.g., 18*) that will comprise vertically-alternating first tiers (e.g., 22*) and second tiers (e.g., 20*) is formed above the conductor tier. The stack comprises laterally-spaced memory-block regions (e.g., 58). Material of the first tiers is of different composition from material of the second tiers. A lowest of the first tiers (e.g., 22*z*) comprises first sacrificial material (e.g., 21). Horizontally-elongated lines (e.g., 13) are formed in the lower portion and are individually between immediately-laterally-adjacent of the memory-block regions. The lines comprise second sacrificial material (e.g., 15) of different composition from the first sacrificial material. The lines individually comprise laterally-opposing projections (e.g., 66) longitudinally there-along in the lowest first tier. Vertically-alternating first tiers and second tiers of an upper portion (e.g., 18U) of the stack are formed above the lower portion and the lines. Channel-material strings (e.g., 13) are formed that extend through the first tiers and the second tiers in the upper portion to the lowest first tier in the lower portion. Horizontally-elongated trenches (e.g., 40) are formed into the stack that are individually between the immediately-laterally-adjacent memory-block regions and extend to the line there-between. The second sacrificial material of the lines and projections is removed through the trenches. Intervening material (e.g., 57) is formed in the trenches and void-spaces left as a result of the removing of the second sacrificial material of the lines. Any other attribute(s) or aspect(s) as shown and/or described herein with respect to other embodiments may be used.

In some embodiments, a method used in forming a memory array (e.g., 12) comprising strings (e.g., 49) of memory cells (e.g., 56) comprises forming a lower portion (e.g., 18L) of a stack (e.g., 18*) that will comprise vertically-alternating first tiers (e.g., 22*) and second tiers (e.g., 20*) on a substrate (e.g., 11). The stack comprises laterally-spaced memory-block regions (e.g., 58). Material of the first tiers is of different composition from material of the second tiers. Horizontally-elongated lines (e.g., 13) are formed in the lower portion and are individually between immediately-laterally-adjacent of the memory-block regions. The lines comprise sacrificial material (e.g., 15). The lines individually comprising laterally-opposing projections (e.g., 66) longitudinally there-along in a lowest of the first tiers (e.g., 22*z*). Vertically-alternating first tiers and second tiers of an upper portion (e.g., 18U) of the stack are formed above the lower portion and the lines. Channel-material strings (e.g., 53) are formed and extend through the first tiers and the second tiers in the upper portion to the lower portion. Horizontally-elongated trenches (e.g., 40) are formed into the stack and are individually between the immediately-laterally-adjacent memory-block regions and extend to the line there-between. The sacrificial material of the lines and projections is removed through the trenches. Intervening material (e.g., 57) is formed in the trenches and void-spaces left as a result of the removing of the sacrificial material of the lines. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s)

of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a conductor tier comprising conductor material on a substrate. A lower portion of a stack that will comprise vertically-alternating first tiers and second tiers is formed above the conductor tier. The stack comprises laterally-spaced memory-block regions. Material of the first tiers is of different composition from material of the second tiers. A lowest of the first tiers comprises first sacrificial material. Horizontally-elongated lines are formed in the lower portion and that are individually between immediately-laterally-adjacent of the memory-block regions. The lines comprise second sacrificial material of different composition from the first sacrificial material. The lines individually comprise laterally-opposing projections longitudinally there-along in the lowest first tier. The vertically-alternating first tiers and second tiers of an upper portion of the stack are formed above the lower portion and the lines, and channel-material strings are formed that extend through the first tiers and the second tiers in the upper portion to the lowest first tier in the lower portion. Horizontally-elongated trenches are formed into the stack that are individually between the immediately-laterally-adjacent memory-block regions and extend to the line there-between. The second sacrificial material of the lines and projections is removed through the trenches. Intervening material is formed in the trenches and void-spaces left as a result of the removing of the second sacrificial material of the lines.

In some embodiments, a method used in forming a memory array comprising strings of memory cells comprises forming a lower portion of a stack that will comprise vertically-alternating first tiers and second tiers on a substrate. The stack comprises laterally-spaced memory-block regions. Material of the first tiers is of different composition from material of the second tiers. Horizontally-elongated lines are formed in the lower portion that are individually between immediately-laterally-adjacent of the memory-block regions. The lines comprise sacrificial material. The lines individually comprise laterally-opposing projections longitudinally there-along in a lowest of the first tiers. The vertically-alternating first tiers and second tiers of an upper portion of the stack are formed above the lower portion and the lines, and channel-material strings are formed that extend through the first tiers and the second tiers in the upper portion to the lower portion. Horizontally-elongated trenches are formed into the stack that are individually between the immediately-laterally-adjacent memory-block regions and extend to the line there-between. The sacrificial material of the lines and projections is removed through the trenches. Intervening material is formed in the trenches and void-spaces left as a result of the removing of the sacrificial material of the lines.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. The lower portion comprises a lowest of the second tiers directly above the conductor material. A lowest of the first tiers is directly above the lowest second tier. The lowest first tier comprises first sacrificial material. A first layer of second-tier material is directly above the lowest first tier. A second layer of different composition from the first layer is directly above the first layer. A third layer of different composition from the second layer is directly above the second layer. The lowest first tier is thicker than the second layer. Horizontally-elongated troughs are formed in the lower portion that extend through the third layer, the second layer, the first layer, the lowest first tier, the lowest second tier, and into the conductor material. The troughs extend into the conductor material to a depth less than thickness of the lowest first tier. The conductor material, the first sacrificial material of the lowest first tier, and the second layer are laterally recessed selectively relative to the lowest second tier, the first layer, and the third layer to form laterally-opposed recesses longitudinally-along individual of the troughs in the conductor material, in the first sacrificial material of the lowest first tier, and in the second layer. Insulating material is deposited along sidewalls of the troughs and into the recesses. The insulating material fills the recesses in the conductor material and the recesses in the second layer. The insulating material less-than-fills the recesses in the lowest first tier. The insulating material is removed from the recesses in the lowest first tier while leaving the insulating material in the recesses in the conductor material and the recesses in the second layer. After removing the insulating material, horizontally-elongated lines are formed in the troughs that are individually between immediately-laterally-adjacent of the memory-block regions. The lines individually comprise laterally-opposing projections longitudinally there-along that are in the laterally-opposed recesses in the lowest first tier. The lines comprise second sacrificial material of different composition from the first sacrificial material. The vertically-alternating first tiers and second tiers of an upper portion of the stack are formed above the lower portion and the lines. Channel-material strings are formed that extend through first tiers and the second tiers in the upper portion to the lowest first tier in the lower portion. Horizontally-elongated trenches are formed into the stack that are individually between the immediately-laterally-adjacent memory-block regions and extend to the line there-between. The second sacrificial material of the lines and projections is removed through the trenches and exposing the first sacrificial material in the lowest first tier. The exposed first sacrificial material is isotropically etched from the lowest first tier through the trenches. After the isotropic etching, conductive material is formed in the lowest first tier that directly electrically couples together the channel material of individual of the channel-material strings and the conductor material of the conductor tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a conductor tier comprising conductor material on a substrate;
   forming a lower portion of a stack that will comprise vertically-alternating first tiers and second tiers above the conductor tier, the stack comprising laterally-spaced memory-block regions, material of the first tiers being of different composition from material of the second tiers, a lowest of the first tiers comprising first sacrificial material;
   forming horizontally-elongated lines in the lower portion that are individually between immediately-laterally-adjacent of the memory-block regions, the lines comprising second sacrificial material of different composition from the first sacrificial material, the lines individually comprising laterally-opposing projections longitudinally there-along in the lowest first tier;
   forming the vertically-alternating first tiers and second tiers of an upper portion of the stack above the lower portion and the lines, and forming channel-material strings that extend through the first tiers and the second tiers in the upper portion to the lowest first tier in the lower portion;
   forming horizontally-elongated trenches into the stack that are individually between the immediately-laterally-adjacent memory-block regions and extend to the line there-between;
   removing the second sacrificial material of the lines and projections through the trenches; and
   forming intervening material in the trenches and void-spaces left as a result of the removing of the second sacrificial material of the lines.

2. The method of claim 1 wherein the second sacrificial material comprises metal material.

3. The method of claim 2 wherein the metal material comprises elemental tungsten.

4. The method of claim 1 wherein the second sacrificial material of the laterally-opposing projections in the lowest first tier of individual of the lines extends laterally into the respective immediately-laterally-adjacent memory-block regions.

5. The method of claim 1 comprising:
   after forming the trenches and before removing the second sacrificial material of the lines and projections, forming lining material to cover sidewalls and bases of the trenches; and
   removing the lining material from covering the bases to expose the second sacrificial material of the lines before removing the second sacrificial material of the lines and projections.

6. The method of claim 1 wherein the lines individually comprise an uppermost surface that is above the lowest first tier.

7. The method of claim 1 wherein the lines individually comprise a bottom surface that is not directly against the conductor material in the conductor tier.

8. The method of claim 1 wherein a lowest surface of the channel material of the channel-material strings is never directly against any of the conductor material of the conductor tier.

9. The method of claim 1 comprising:
   exposing the first sacrificial material in the lowest first tier in the trenches;
   isotropically etching the exposed first sacrificial material from the lowest first tier through the trenches;
   after the isotropically etching, forming conductive material in the lowest first tier that directly electrically couples together the channel material of individual of the channel-material strings and the conductor material of the conductor tier; and
   after forming the conductive material, forming at least a majority of the intervening material in the trenches and the void-spaces.

10. The method of claim 9 wherein the conductive material in the lowest first tier is directly against a sidewall of the channel material of the channel-material strings.

11. The method of claim 9 wherein the conductive material in the lowest first tier is directly against an uppermost surface of the conductor material of the conductor tier.

12. The method of claim 1 wherein the conductor material of the conductor tier comprises upper conductor material directly above lower conductor material, the upper and lower conductor materials being of different compositions relative one another.

13. The method of claim 12 wherein the lines individually comprise a bottom surface that is directly against the upper conductor material.

14. The method of claim 12 wherein the lines individually comprise a bottom surface that is directly against the lower conductor material.

15. A method used in forming a memory array comprising strings of memory cells, comprising:
   forming a lower portion of a stack that will comprise vertically-alternating first tiers and second tiers on a substrate, the stack comprising laterally-spaced memory-block regions, material of the first tiers being of different composition from material of the second tiers;
   forming horizontally-elongated lines in the lower portion that are individually between immediately-laterally-adjacent of the memory-block regions, the lines comprising sacrificial material, the lines individually comprising laterally-opposing projections longitudinally there-along in a lowest of the first tiers;
   forming the vertically-alternating first tiers and second tiers of an upper portion of the stack above the lower portion and the lines, and forming channel-material strings that extend through the first tiers and the second tiers in the upper portion to the lower portion;
   forming horizontally-elongated trenches into the stack that are individually between the immediately-laterally-adjacent memory-block regions and extend to the line there-between;
   removing the sacrificial material of the lines and projections through the trenches; and
   forming intervening material in the trenches and void-spaces left as a result of the removing of the sacrificial material of the lines.

16. A method used in forming a memory array comprising strings of memory cells, comprising:
   forming a conductor tier comprising conductor material on a substrate;

forming a lower portion of a stack that will comprise vertically-alternating first tiers and second tiers above the conductor tier, the stack comprising laterally-spaced memory-block regions, material of the first tiers being of different composition from material of the second tiers; the lower portion comprising:
- a lowest of the second tiers directly above the conductor material;
- a lowest of the first tiers directly above the lowest second tier, the lowest first tier comprising first sacrificial material;
- a first layer of second-tier material directly above the lowest first tier;
- a second layer of different composition from the first layer directly above the first layer;
- a third layer of different composition from the second layer directly above the second layer; and
- the lowest first tier being thicker than the second layer;

forming horizontally-elongated troughs in the lower portion that extend through the third layer, the second layer, the first layer, the lowest first tier, the lowest second tier, and into the conductor material; the troughs extending into the conductor material to a depth less than thickness of the lowest first tier;

laterally recessing the conductor material, the first sacrificial material of the lowest first tier, and the second layer selectively relative to the lowest second tier, the first layer, and the third layer to form laterally-opposed recesses longitudinally-along individual of the troughs in the conductor material, in the first sacrificial material of the lowest first tier, and in the second layer;

depositing insulating material along sidewalls of the troughs and into the recesses, the insulating material filling the recesses in the conductor material and the recesses in the second layer, the insulating material less-than-filling the recesses in the lowest first tier;

removing the insulating material from the recesses in the lowest first tier while leaving the insulating material in the recesses in the conductor material and the recesses in the second layer;

after removing the insulating material, forming horizontally-elongated lines in the troughs that are individually between immediately-laterally-adjacent of the memory-block regions, the lines individually comprising laterally-opposing projections longitudinally there-along that are in the laterally-opposed recesses in the lowest first tier, the lines comprising second sacrificial material of different composition from the first sacrificial material;

forming the vertically-alternating first tiers and second tiers of an upper portion of the stack above the lower portion and the lines, and forming channel-material strings that extend through first tiers and the second tiers in the upper portion to the lowest first tier in the lower portion;

forming horizontally-elongated trenches into the stack that are individually between the immediately-laterally-adjacent memory-block regions and extend to the line there-between;

removing the second sacrificial material of the lines and projections through the trenches and exposing the first sacrificial material in the lowest first tier;

isotropically etching the exposed first sacrificial material from the lowest first tier through the trenches; and after the isotropically etching, forming conductive material in the lowest first tier that directly electrically couples together the channel material of individual of the channel-material strings and the conductor material of the conductor tier.

17. The method of claim 16 wherein the removing of the insulating material comprises isotropic etching thereof.

18. The method of claim 16 wherein the laterally recessing of the conductor material, the first sacrificial material of the lowest first tier, and the second layer comprises isotropic etching thereof.

19. The method of claim 18 wherein at two of the conductor material, the first sacrificial material of the lowest first tier, and the second layer are of the same composition relative one another, the isotropic etching thereof occurring simultaneously.

20. The method of claim 19 wherein all three of the conductor material, the first sacrificial material of the lowest first tier, and the second layer are of the same composition relative one another.

21. The method of claim 19 wherein only two of the conductor material, the first sacrificial material of the lowest first tier, and the second layer are of the same composition relative one another.

22. The method of claim 16 wherein none of the conductor material, the first sacrificial material of the lowest first tier, and the second layer are of the same composition relative one another.

23. The method of claim 16 wherein the conductor material of the conductor tier comprises upper conductor material directly above lower conductor material, the upper and lower conductor materials being of different compositions relative one another.

24. The method of claim 23 wherein,
- the lowest first tier is thicker than the upper conductor material;
- the horizontally-elongated troughs are formed through the upper conductor material to extend to the lower conductor material; and
- the laterally recessing laterally recesses the upper conductor material selectively relative to the lower conductor material to form the laterally-opposed recesses in the conductor material to be in the upper conductor material.

25. The method of claim 23 wherein the horizontally-elongated troughs extend only partially into the upper conductor material.

26. The method of claim 16 wherein the lines individually comprise an uppermost surface that is above the second layer.

27. The method of claim 16 wherein the second sacrificial material comprises metal material.

28. The method of claim 27 wherein the metal material comprises elemental tungsten.

29. The method of claim 16 wherein the second sacrificial material of the laterally-opposing projections in the lowest first tier of individual of the lines extends laterally into the respective immediately-laterally-adjacent memory-block regions.

30. The method of claim 16 comprising forming an insulative liner in the troughs after removing the insulator material and prior to forming the second sacrificial material.

31. The method of claim 30 wherein at least some of the insulative liner remains in a finished circuitry construction.

* * * * *